United States Patent [19]
Goto

[11] Patent Number: 6,021,085
[45] Date of Patent: Feb. 1, 2000

[54] READ ONLY SEMICONDUCTOR MEMORY DEVICE

[75] Inventor: Koji Goto, Tokyo, Japan

[73] Assignee: Mitsubishi Denki Kabushiki Kaisha, Tokyo, Japan

[21] Appl. No.: 08/947,111

[22] Filed: Oct. 8, 1997

[30] Foreign Application Priority Data

Apr. 25, 1997 [JP] Japan ................................. 9-109362

[51] Int. Cl.[7] .................................................. G11C 7/00
[52] U.S. Cl. ................. 365/230.03; 365/94; 365/189.05; 365/203
[58] Field of Search ............................. 365/203, 230.03, 365/94, 189.05, 210, 200

[56] References Cited

U.S. PATENT DOCUMENTS

| | | | |
|---|---|---|---|
| 4,942,556 | 7/1990 | Sasaki et al. | 365/185.2 X |
| 4,975,873 | 12/1990 | Nakabayashi et al. | 365/49 |
| 5,745,409 | 4/1998 | Wong et al. | 365/185.03 |

FOREIGN PATENT DOCUMENTS

| | | |
|---|---|---|
| 63-237464 | 10/1988 | Japan . |
| 8161895 | 6/1996 | Japan . |

*Primary Examiner*—Do Hyun Yoo
*Attorney, Agent, or Firm*—Leydig, Voit & Mayer

[57] ABSTRACT

A read only semiconductor memory includes a memory cell array having columns of memory cell groups, each group including memory cells arranged in rows and columns. A flag memory indicates whether stored data has been inverted. Word lines in rows connect memory cells and flag memory cells. Bit line groups connect memory cells of the memory cell groups. A flag bit line includes lines connecting to the flag memory cells. A bit line selector and a flag bit selector select a flag bit line. An output circuit may convert stored information. Row address signals select one of the word lines, and the information stored in memory cells and flag memory cells connected to the word line are read on the corresponding bit lines. A bit line selector receives the column address signals, and a bit line selector selects one of the bit lines, and a flag bit line selector selects one of the flag bit lines, which appear on the signal lines. The output circuit carries out an exclusive logical sum between the information appearing on the respective signal lines and outputs the results as read data. The semiconductor memory device can reduce circuit size and facilitate high density integration, reducing power consumption.

15 Claims, 12 Drawing Sheets

| ORIGINAL DATA (DATA TO BE STORED) | WRITTEN DATA (STORED DATA) | FLAG BIT |
|---|---|---|
| 11111111 | 11111111 | 1 |
| 00000000 | 11111111 | 0 |
| 00110000 10 | 11001111 01 | 0 |
| 00000011 00 | 11111100 11 | 0 |
| 11111110 10 | 11111110 10 | 1 |
| 00100100 01 | 11011011 10 | 0 |
| 11100000 11 | 11100001 11 | 1 |

| NO. OF "0"S | 38/70 | 18+4=22/70 (77) | |

FIG. 4

| ORIGINAL DATA (DATA TO BE STORED) | | WRITTEN DATA (STORED DATA) | | FLAG BIT | |
|---|---|---|---|---|---|
| UPPER | LOWER | UPPER | LOWER | UPPER | LOWER |
| 1111011 | 1111111 | 1111011 | 1111111 | 1 | 1 |
| 0000001 | 1111011 | 1111110 | 1111011 | 0 | 1 |
| 0011000 | 0101111 | 1100111 | 0101111 | 0 | 1 |
| 0000001 | 1001111 | 1111110 | 1001111 | 0 | 1 |
| 1100111 | 0101001 | 1100111 | 1010110 | 1 | 0 |
| 0010010 | 0011101 | 1101101 | 0011101 | 0 | 1 |
| 1111000 | 0111111 | 1111000 | 0111111 | 1 | 1 |
| NUMBERS OF "0"S | | | | | |
| 28 | 13 | 12 | 12 | 4 | 1 |
| 41/98 | | 24+5=29/98(112) | | | |

FIG. 6

| ORIGINAL DATA (DATA TO BE STORED) | WRITE DATA (STORED DATA) | FLAG BIT |
|---|---|---|
| 1101110101000000 | 1111111111111111 | 1 |
| 1111011111111111 | 1111011111111111 | 0 |
| 0000001111101011 | 1101111010111011 | 1 |
| 0011000010101111 | 1110111011101111 | 1 |
| 0000001100011111 | 1101111100001111 | 1 |
| 1100111010101001 | 1100111010101001 | 0 |
| 0010010000111101 | 1111100101011101 | 1 |
| NO. OF "0"S 45/98 | SPECIFIC PATTERN =1101110101000000  21+2=23/98(105) | |

FIG. 8

| ORIGINAL DATA (DATA TO BE STORED) | WRITE DATA (STORED DATA) | FLAG BIT |
|---|---|---|
| 1101110100000 | 1111111111111 | 0 |
| 0000100100000 | 1111111111111 | 1 |
| 1111011111111 | 1111110111111 | 0 |
| 0000001111011 | 1101111010111111 | 1 |
| 0011000010111 | 1110110110111 | 1 |
| 1111000011111 | 1111100111111 | 0 |
| 0010010001101 | 1111100101101 | 1 |

NO. OF "0"S  47/98    13+3=16/98(105)

SPECIFIC PATTERN 1=1101110101000000
SPECIFIC PATTERN 2=0000100100000000

FIG. 12

READ ONLY SEMICONDUCTOR MEMORY DEVICE

BACKGROUND OF THE INVENTION

1. Field of the Invention

The invention relates to a read only semiconductor memory device for reading information stored in a selected memory cell, by discharging or maintaining the electrical potentials of pre-charged bit lines.

2. Description of the Prior Art

A conventional read only semiconductor memory device (referred to as ROM below) reads out stored information (either logic "0" or logic "1"), by transferring or not the electrical potential of the bit lines connected to memory cells of the memory, that is, by discharging or maintaining the electrical potential of the bit lines.

The electrical potential is transferred according to the information stored in the memory cell. When transferring the electrical potential, a significant electrical power is consumed. A reduction of the electrical power consumption of a ROM is disclosed in the Laid-open Japanese patent publication Hei 8-161895. In this example, a ROM includes memory cells arranged in a plurality of rows and columns. When a memory cell stores information "0", the memory cell is made conductive between a bit line and a ground node. When a memory cell stores information "1", the memory cell maintains a non-conductive state between the bit line and the ground node. In this type of ROM, a control flag memory cell is provided for respective rows of the memory cells, and an EX-OR gate is provided for respective rows.

When the number of "0" 's included in one row exceeds a predetermined number, the data in the row are inverted and stored. When the number of "0" 's included in one row is smaller than the predetermined number, the data are stored without being inverted.

If the plurality of the memory cells arranged in one row store inverted data (converted information), the control flag memory cells corresponding to the row store the information "0", respectively. If the plurality of the memory cells arranged in one row store non-inverted data (non-converted information), the control flag memory cells corresponding to the row store the information "1", respectively.

The respective EX-OR gates produce an exclusive logical sum between the information read from the memory cells in the rows and the information read from the control flag memory corresponding to the row. The EX-OR gates output results of addition as information read from the memory cell arrangement. That is to say, when the information stored in the memory cells is inverted information, the EX-OR gates invert the information and output the result. When the information stored in the memory cells are non-inverted information, the EX-OR gates output the information without inverting.

In this manner, the number of "0" 's stored in the memory cells is reduced. By reducing the number of stored "0" 's, less electrical potential is transferred from the bit lines when the information is read from the memory cells. As a result, power consumption is also reduced.

In addition, power consumption may be reduced by dividing the memory cells into a plurality of blocks in the row direction, and by providing a control flag memory cell for corresponding blocks.

However, in the above-mentioned ROM, since the EX-OR gates are provided for every row, the size of the surrounding circuit other than the memory cell array becomes large. Moreover, since the EX-OR gates are too large to be placed between the bit lines, it takes a large area to place the EX-OR gates on the semiconductor substrate. This occupation of the large area prevents large scale integration of a semiconductor circuit.

SUMMARY OF THE INVENTION

It is an object of the present invention to provide a read only semiconductor memory device to improve integration scale of the circuit, to decrease the circuit size, and to reduce power consumption.

According to one aspect of the invention, a read only semiconductor memory device comprises a memory cell array having a plurality of columns of memory cell groups, each memory cell group comprising a plurality of memory cells, arranged in a plurality of rows and columns, for storing information "0" and information "1"; a flag memory cell group having flag memory cells corresponding to respective memory cells, arranged in a plurality of rows and columns, for storing information "0" and information "1" respectively indicating inverted and non-inverted information stored in the corresponding memory cells; a bit line selector having a plurality of bit line selecting portions corresponding to respective bit line groups wherein the respective bit line selecting portions select one of the bit lines of the corresponding bit line groups in response to a bit line selecting signal; a flag bit line selector for selecting one of the flag bit lines in the flag bit line group in response to a flag bit line selecting signal; and an output circuit for converting and outputting, or outputting without converting, the information appearing on the bit lines selected by the respective bit line selecting portions, based on information appearing on the flag bit line selected by the flag bit line selector.

According to another aspect of the invention, the read only semiconductor memory device is provided wherein the output circuit further comprises a plurality of output portions corresponding to the bit line selecting portions of the bit line selector, for inverting or not inverting the information appearing on the bit lines selected by the corresponding bit line selecting portions, based on information appearing on the flag bit line selected by the flag bit line selector.

According to a further aspect of the invention, the read only semiconductor memory device is provided wherein said output circuit further comprises a specific pattern memory having bits in the same number as the number of the columns of the memory cell groups in the memory cell array, for storing a specific pattern of the corresponding memory cell array; a pattern switch for receiving information on the flag bit line selected by the flag bit line selector, for outputting a specific pattern from the specific pattern memory when receiving converted information, and for outputting a non-specific pattern when receiving non-converted information; and a plurality of output portions corresponding to the bit line selecting portions of the bit line selector for inverting or not inverting the information appearing on the bit lines selected by the corresponding line selecting portions according to the pattern information received from the pattern switch.

According to a further aspect of the invention, a read only semiconductor memory device comprises a memory cell array having a plurality of columns of memory cell groups, and being divided into an upper array and a lower array, each array comprising a plurality of memory cells, arranged in a plurality of rows and columns, for storing information "0" and information "1"; a flag memory cell group divided into upper and lower portions corresponding to the upper and the lower memory cell arrays, respectively, the flag memory cell group having a plurality of flag memory cells, arranged in a plurality of rows and columns, for storing information "0" or information "1" according to inverted or non-inverted information stored in the memory cells corresponding to the upper and the lower arrays; a bit line selector, divided into upper and lower portions corresponding to the upper and the lower memory cell arrays, the bit line selector having a plurality of bit line selecting portions corresponding to respective bit line groups, wherein the respective bit line selecting portions select one of the bit lines of the corresponding bit line groups in response to a bit line selecting signal; a flag bit line selector, divided into upper and lower portions corresponding to the upper and the lower memory cell arrays, for selecting one of the flag bit lines in the flag bit line group in response to the flag bit line selecting signal; and an output circuit, divided into upper and lower portions corresponding to the upper and the lower memory cell arrays, for converting and outputting, or for outputting, without converting, the information appearing on the bit lines selected by the respective bit line selecting portions, based on information appearing on the flag bit line selected by the flag bit line selector.

According to a still further aspect of the invention, a read only semiconductor memory device comprises a memory cell array having a plurality of columns of memory cell groups, each memory cell group comprising a plurality of memory cells, arranged in a plurality of rows and columns, for storing information "0" and information "1"; a flag memory cell group having flag memory cells corresponding to respective memory cells, arranged in a plurality of rows and columns, for storing information "0" and information "1" indicating information stored in the memory cells based on a first specific pattern or information stored in the memory cells based on a second specific pattern, respectively; a bit line selector having a plurality of bit line selecting portions corresponding to respective bit line groups wherein the respective bit line selecting portions select one of the bit lines of the corresponding bit line groups in response to a bit line selecting signal; a flag bit line selector for selecting one of the flag bit lines in the flag bit line group in response to a flag bit line selecting signal; and an output circuit for converting the information appearing on the signal line selected by the selecting portions in the bit selector, according to one of the first specific pattern and the second specific pattern based on the information appearing on the flag bit line selected by the flag bit line group.

BRIEF DESCRIPTION OF THE DRAWINGS

FIG. 4 shows stored data and written data according to the first embodiment of the present invention.

FIG. 6 shows data to be stored and written data according to the second embodiment of the present invention.

FIG. 8 shows one example of the data to be stored and the written data according to the third embodiment of the present invention.

FIG. 12 shows one example of the data to be stored and the written data according to the sixth embodiment of the present invention.

DETAILED DESCRIPTION OF THE PREFERRED EMBODIMENT

Embodiment 1.

Figure 1:
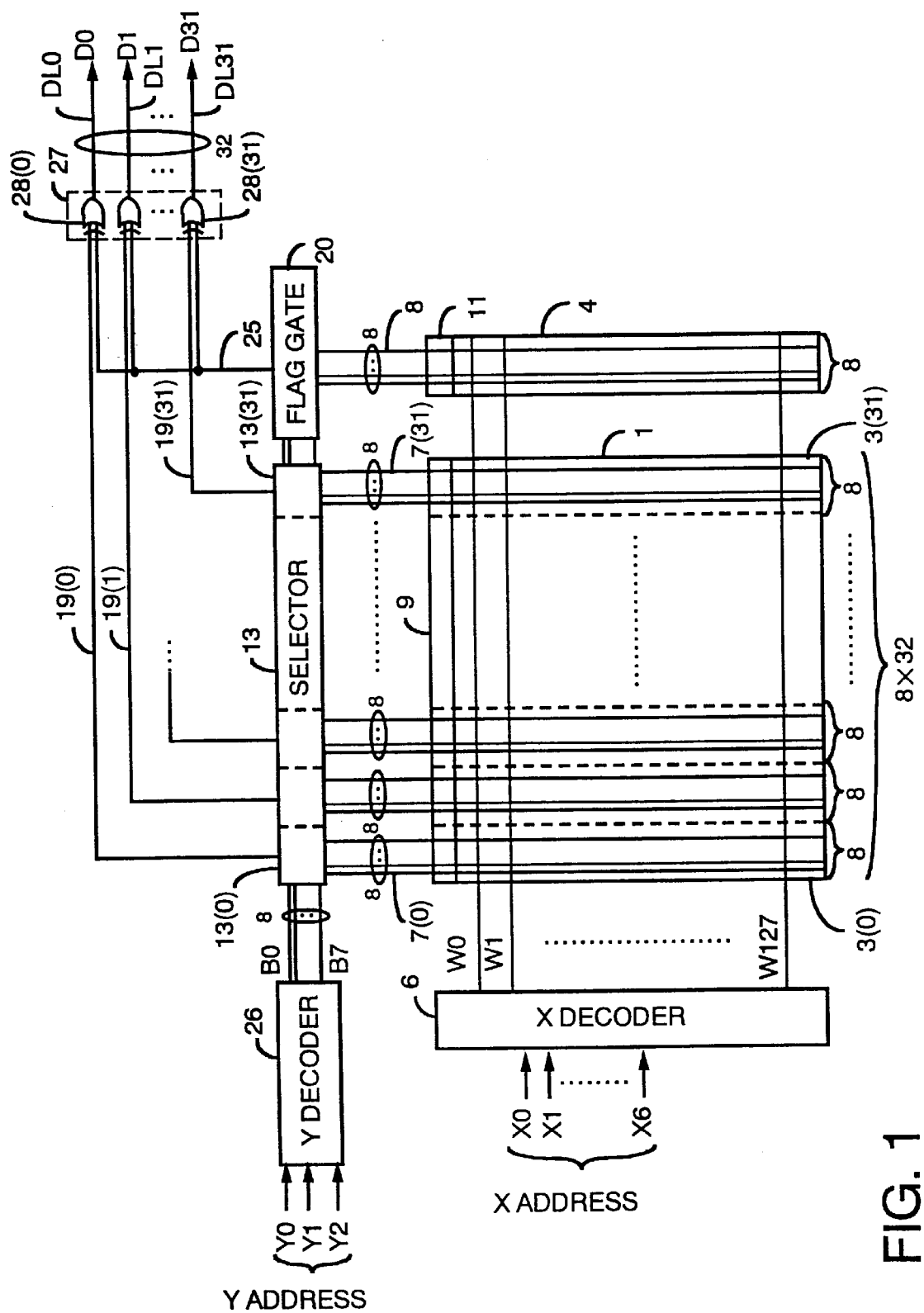
FIG. 1 shows a circuit according to a first embodiment of the present invention.
Figure 2:
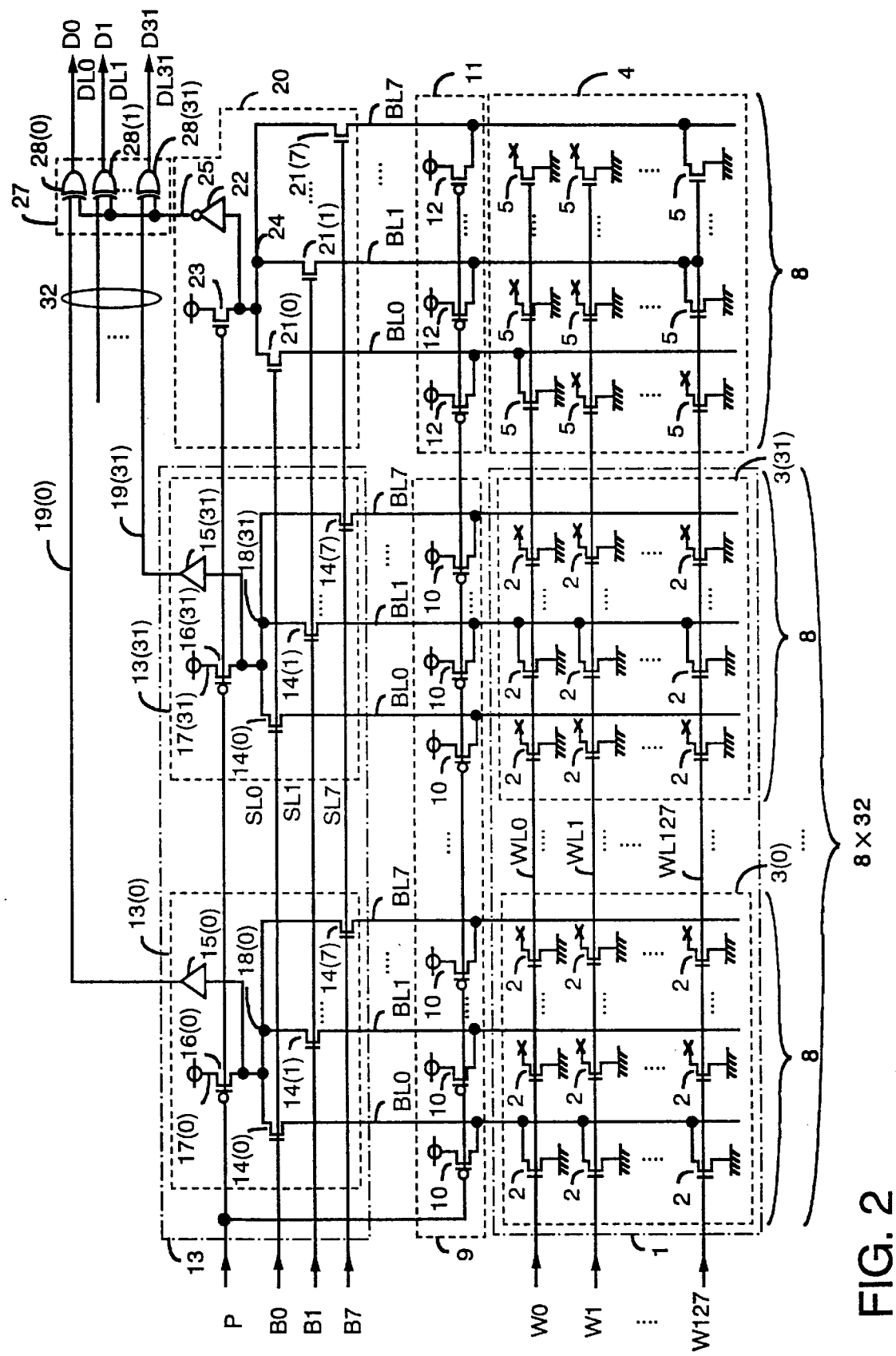
FIG. 2 shows the circuit of the present invention according to the first embodiment.
Figure 3:
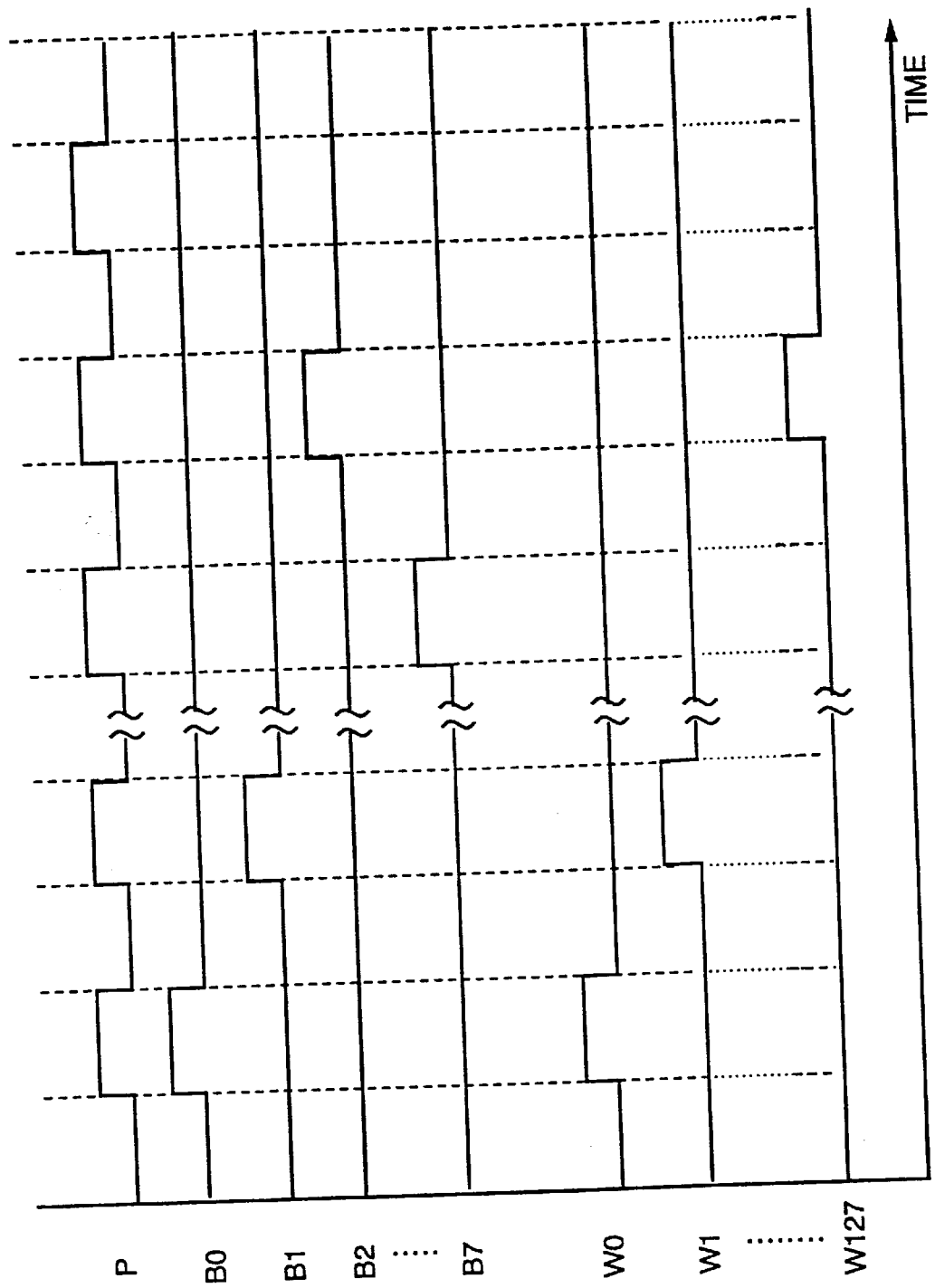
FIGS. 3A–3H are timing charts showing the timing of the respective signals in the present invention according to the first embodiment.

FIG. 1 and FIG. 2 show a read only memory circuit according to a first embodiment of the present invention. The circuit of FIG. 1 comprises a memory cell array 1 including a plurality of memory cell groups 3(0)–3(31). The respective memory cell groups 3(0)–3(31) comprise a plurality of memory cells 2 arranged in a plurality of rows and columns for storing information "0" or "1". For the sake of explanation, it is assumed that the memory cell array 1 comprises 32 columns (32 units) of memory cell groups 3(0)–3(31). The respective memory cell groups 3(0)–3(31) comprise, for instance, 128 rows×8 columns of memory cells from 2(0, 0, 0)–2(0, 127, 7) to 2(31, 0, 0)–2(31, 127, 7). Each row of the memory cell groups 3(0)–3(31) constitutes one word (32 bits).

The respective memory cells 2 comprise an N channel MOS transistor. The memory cells 2 store an information "0" between the main electrodes (source electrode and drain electrode) when a high electrical potential is applied to the control electrode (gate electrode) via a bit line, and store an information "1" when a low electrical potential is applied to the control electrode via a bit line. The information "1" is also provided when the drain electrode of the N channel MOS transistor is disconnected from the bit line although the source electrode is connected to the ground electrical potential.

When the data to be stored includes a larger number of "0"'s than "1"'s, the memory cells store inverted information. On the contrary, when the data to be stored includes fewer "0"'s than "1"'s, the memory cells store non-inverted information, that is, the same data as the data to be stored.

In FIG. 1 and FIG. 2, numbers in parentheses referring to the memory cells 2 represent a memory cell number, a row number, and a column number in order in a memory cell group, including the memory cells 2. A number in parentheses of memory cell groups 3 represents the number of the memory cell group.

The number of the memory cell group 3 should not be limited to 32. The number could be 16 or 64 corresponding to the number of bits in one word to be processed. Moreover, the column number of the memory cell groups 3 should not be limited to 8, but also could be 16 or 32. The row number of the memory cells in the memory cell array 1 should not be limited to 128, but could also be, for example, 256, 512.

A flag memory group 4 comprises a plurality of flag memory cells 5 which are arranged in a plurality of rows and columns. The rows of the flag memory cells 5 correspond to the rows of the memory cell groups 3(0)–3(31), and the columns of the flag memory cells 5 correspond to the memory cell group number. The information stored in the respective flag memory cells 5 is "0" or "1". Information "0" represents that the data stored in the memory cell groups 3(0)–3(31) is inverted and the information "1" represents that the data stored in the memory cell groups 3(0)–3(31) is not inverted.

For the sake of the explanation, it is assumed that the flag memory cell group 4 comprises flag memory cells 5(0, 0)–5(127, 7) arranged in 128 rows×8 columns. The flag memory cells 5 comprise N channel MOS transistors. The flag memory cells 5 store an information "0" between the main electrodes (source electrode and drain electrode) when a high electrical potential is applied to the control electrode (gate electrode) via a bit line, and store an information "1" when a low electrical potential is applied to the control electrode via a bit line. The information "1" is also provided when the drain electrode N channel MOS transistor is disconnected from the bit line although the source electrode is connected to the ground electrical potential.

The flag memory cell group 4 comprises a flag memory cell 5 for every word of the memory cell array 1. The respective flag memory cells 5 store "0" when the data stored in the memory cells 2 are inverted, and store "1" when the data are not inverted. The numbers in parentheses of the flag memory cells 5 represent a row number and a column number, in that order.

WL0–WL127 are word lines corresponding to a plurality of rows (in this example, 128 rows), and are connected to the corresponding rows of the memory cells 2 and the flag memory cells 5.

An X-decoder 6 decodes row address signal X0–X6 received from the outside, and generates word line control signals W0–W127 for selecting one of the plurality of the word lines WL0–WL127. The selected word lines receive word line selecting signals W0–W127 having high electrical potentials (corresponding to the power source potential), and the non-selected word lines receive word line selecting signals W0–W127 having low electrical potentials (corresponding to the ground electrical potential).

The seven row address signals are depicted as X0–X6 in this example, since the number of word lines is assumed to be 128. The number of the row address signals, however can be changed according to the number of the word lines.

A plurality of upper bit line groups 7(0)–7(31) corresponds to the respective memory cell groups 3(0)–3(31). The respective memory cell groups 3(0)–3(31) have a plurality of bit lines BL0–BL7 which are connected to the respective memory cells located at corresponding columns in the memory cell groups. The number of the bit lines 7(0)–7(31) is the same as those of the memory cell groups 3(0)–3(31). For example, if the number of the memory cell groups 3(0)–3(31) is 32, then the number of the bit lines 7(0)–7(31) is also 32.

The number of bit lines BL0–BL7 in the upper bit line groups 7(0)–7(31) is the same the number of columns of the memory cells in the memory cell groups 3(0)–3(31). For example, if the respective memory cell groups include eight columns of the memory cells, the bit line groups include eight 8 bit lines. The number in the parentheses in the bit line groups 7 represents the number of the memory cell groups 3.

Flag bit line group 8 has a plurality of flag bit lines BL0–BL7 corresponding to the flag memory cell group 4. The respective flag bit lines BL0–BL7 are connected to the corresponding columns in the flag memory cell group 4.

The number of the flag bit lines BL0–BL7 in the flag bit line group 8 is same as the number of the columns of the flag memory cell group 4. For example, if the flag memory cell group 4 includes eight columns of the flag memory cells, the flag bit line group 8 includes eight flag bit lines.

A first pre-charger 9 pre-charges a plurality of bit lines BL0–BL7 in the upper bit line groups 7(0)–7(31). This first pre-charger 9 comprises pre-charge transistors from 10(0, 0)–10(0, 7) to 10(32, 0)–10(32, 7), which correspond to the bit lines BL0–BL7 in the plurality of the upper bit line groups 7(0)–7(31). The respective pre-charge transistors are connected between the corresponding bit lines and the power source potential nodes having the power source potential. Each pre-charge transistor comprises a P channel MOS transistor, having a control electrode (gate electrode) supplied with a pre-charge signal P. The number in the parentheses in the pre-charge transistors 10 represents a row number and a column number in the memory cell group 3.

A second pre-charger 11 pre-charges the flag bit lines BL0–BL7 in the flag bit line group 8. This second pre-charger 11 comprises pre-charge transistors 12(0, 0)–12(0, 7), which correspond to the bit lines BL0–BL7 in the flag bit line group 8. The respective pre-charge transistors are connected between the corresponding bit lines and the power source potential nodes. Each pre-charge transistor comprises a P channel MOS transistor, having a control electrode (gate electrode) supplied with a pre-charge signal P. The number in the parentheses in the pre-charge transistors 12 represents a column number in the flag memory cell group 4.

A bit line selector 13 comprises bit line selecting portions 13(0)–13(31) corresponding to the respective upper bit line groups 7(0)–7(31).

Receiving the line selecting signals B0–B7, the respective bit line selecting portions 13(0)–13(31) select one of bit lines BL0–BL7. The line selecting portions 13(0)–13(31) comprise respective buffers 15(0)–15(31) and pre-charge transistors 16(0)–16(31).

Selecting transistors 14(0)–14(7) in the respective bit line selecting portions 13(0)–13(31) correspond to the plurality of the bit lines BL0–BL7 of the respective upper bit line groups 7(0)–7(31). The selecting transistors 14(0)–14(7) comprise respective N channel MOS transistors. The selecting transistors 14(0)–14(7) are connected between the corresponding bit lines BL0–BL7 and the first common nodes 18(0)–18(31), and their control electrodes (gate electrodes) receive the bit line selecting signals B0–B7 via the signal lines SL0–SL7.

The input node of the buffer 15(0)–15(31) in the respective bit line selecting portions 13(0)–13(31) are connected to the first common nodes 18(0)–18(31), and their output nodes are connected to corresponding signal lines 19(0)–19(31).

The respective pre-charge transistors 16(0)–16(31) are connected between the power source potential nodes 17(0)–17(31) and the corresponding first common nodes 18(0)–18(31). The pre-charge transistors 16(0)–16(31) comprise respective P channel MOS transistors having control electrodes (gate electrodes) receiving the pre-charge signal P.

The numbers in parentheses in the bit selecting portions 13(0)–13(31), the buffer 15(0)–15(31), the pre-charge transistor 16(0)–16(31), the common nodes 18(0)–18(31), and the signal lines 19(0)–19(31) indicate the number of the memory cell groups. The number in the parentheses in the selecting transistors 14(0)–14(7) indicates the column number in the memory cell group 3.

Receiving bit line selecting signals B0–B7, a flag line selector (flag gate) 20 selects one of the flag bit lines BL0–BL7 in the flag bit line group 8. The flag bit line selector 20 comprises a plurality of selecting transistors 21(0)–21(7), an inverter 22, and a pre-charge transistor 23.

The respective selecting transistors 21(0)–21(7) comprise respective N channel MOS transistors. The selecting transistors 21(0)–21(7) are connected between the corresponding flag bit lines BL0–BL7 and the second common node 24, and their control electrodes (gate electrodes) are connected to the corresponding signal lines SL0–SL7.

An input node of the inverter 22 is connected to the second common node 24, and its output node is connected to the signal line 25. The pre-charge transistor 23 is connected between the power source potential node and the second common node 24, and comprises a P channel MOS transistor having control electrode (gate electrode) receiving the pre-charge signal P.

The Y-decoder 26 decodes column address signals Y0, Y1, and Y2 to generate bit line selecting signals B0–B7 for selecting one of the signal lines SL0–SL7 in the respective bit line group 7(0)–7(31). The selected signal lines SL0–SL7 are supplied with bit line selecting signals B0–B7 having high electrical potentials (corresponding to the power source potential), and the non-selected signal lines of SL0–SL7 are supplied with bit line selecting signals B0–B7 having low electrical potentials (corresponding to the ground potential).

In this example, since eight bit lines BL0–BL7 in the respective upper bit line groups 7(0)–7(31), and eight flag bit lines BL0–BL7 in the flag bit line group 11 are assumed, three column address signals Y0, Y1 and Y2 are necessary. However, the number of the column address signals can be changed according to the number of the bit lines of the bit line groups and of the flag bit line group.

The output circuit 27 comprises output portions 28(0)–28(31) corresponding to the bit line selecting portions 13(0)–13(31). The flag bit line selector 20 selects a flag bit line from the flag bit lines BL0–BL7 in the flag bit line group 8. The output portion of 28(0)–28(31) inverts or not the information appearing on the bit lines BL0–BL7 selected by the bit line selecting portions 13(0)–13(31) according to the information on the flag bit lines BL0–BL7 selected by the flag bit line selector 20.

The respective output portions 28(0)–28(31) comprise exclusive logic circuits (EX-OR circuits). The first input terminals of the respective output portions 28(0)–28(31) are connected to the signal lines 19(0)–19(31), which are connected to the respective bit line selecting portions 13(0)–13(31) in the bit line selector 13. The second input terminals of the output portions 28(0)–28(31) are connected to the signal line 25, which is connected to the selector 20. The output terminals of the respective output portions 28(0)–28(31) are connected to the corresponding data output lines DL0–DL31.

If the selected flag memory cell 5 stores "0", the respective output portions 28(0)–28(31) invert and output the information stored in the selected memory cells 2. If the selected flag memory cell 5 stores "1", the respective output portions 28(0)–28(31) output the information stored in the selected memory cells 2 without inverting the information.

The operation of the read only semiconductor memory device is explained below. The read only semiconductor memory device reads the information stored in the memory cells 2 of the memory cell array 1 for every word. The electrical potential of the bit lines BL0–BL7 is changed to a higher level (referred to as H level below), before or immediately after the information is read. This time period, in which the electrical potential of the information is raised to the higher level, is called the pre-charge period. The operation during this pre-charge period is explained below.

During the pre-charge period, the pre-charge signal P, the bit line selecting signal B0–B7, and the word line control signal W0–W127 are at low level (referred to as L level below) as illustrated in FIGS. 3A–3H.

During the pre-charge period, since the word line control signals W0–W127 are all at L level, none of the memory cells 2 is selected, therefore none of the electrical potentials of the bit lines BL0–BL7 influences the memory cells 2. Since the bit line selecting signals B0–B7 are also all at L level, the selecting transistors 14(0)–14(7) in the bit line selector 13 are non-conductive. Thus, none of the electrical potentials of the bit lines BL0–BL7 is influenced by the bit line selector 13. Since the pre-charge signal P is at L level, all of the pre-charge transistors 10 are conductive. Therefore, all the bit lines BL0–BL7 are pre-charged to the level of the electrical potential of the power source potential node, that is, to H level.

In the respective bit line selecting portions 13(0)–13(31) in the bit line selector 13, since the pre-charge transistors 16(0)–16(31) are conductive, the common nodes 18(0)–18(31) are also pre-charged to H level. Since the input node of the respective buffers 15(0)–15(31) are at H level, the H level also appears at the output nodes of the respective buffers 15(0)–15(31). Thus the electrical potentials of the respective signal lines 19(0)–19(31) also become H level.

Since the word line control signals W0–W127 are all at L level, none of the flag memory cells 5 is selected. Therefore, none of the electrical potentials of the flag bit lines BL0–B17 influences to the flag memory cells 5. Since the bit line selecting signals B0–B7 are all at L level, none of the selecting transistors 21(0)–21(7) in the flag bit line selector 20 is conductive. Thus, the none of the electrical potentials of the flag bit lines BL0–BL7 is influenced by the flag bit line selector 20. As a result, since the pre-charge signal P is at L level, all of the pre-charge transistors 12 in the second pre-charger 11 are conductive. Therefore, all electrical potentials of the flag bit lines BL0–BL7 are pre-charged to the electrical potential of the power source potential nodes, that is, to H level.

In the flag bit line selector 20, since the pre-charge transistor 23 is conductive, the second common node 24 is also at the electrical potential of the power source potential node, that is, at H level. Since the input node of the inverter 22 is at H level, H level also appears at the output node, and the electrical potential of the signal line 25 rises to H level.

In this manner, the electrical potentials of all the bit lines BL0–BL7, all the flag bit lines BL0–B17, all the first common nodes 18(0)–18(31), the second common node 24, all the signal lines 19(0)–19(31). and the signal line 25 rise to H level.

Reading of the information stored in the memory cells 2 is explained below. The row decoder 6 receives the line addresses X0–X6, and outputs the word line control signals W0–W127, based on the received line addresses X0–X6, to the word lines WL0–WL127. That is, one of the word lines WL0–WL127 is selected, and is raised to H level. The rest of the word lines remains at L level (see FIGS. 3F–3H). At this time, the pre-charge signal P rises to H level.

If the memory cell 2 connected to the selected word line stores the information "0", the electrical potentials of the bit lines BL0–BL7 are discharged to the ground (L level) via the memory cells 2, which means that the information "0" is read. If the memory cell 2 connected to the selected word line stores information "1", the electrical potentials of the bit lines BL0–BL7 are not discharged to the ground via the connected memory cells. Therefore, the electrical potentials of the bit lines BL0–BL7 remain at H level, which means that the information "1" is read.

If the flag memory cell 5 connected to the selected word line stores information "0", the electrical potentials of the flag bit lines BL1–BL7 are discharged to the ground (L level) via the flag memory cell 5, which means that the information "0" is read. If the flag memory cell 5 connected to the selected word line stores information "1", the electrical potentials of the flag bit lines BL1–BL7 which are connected to the flag memory cells 5, connected to the selected word line, are not discharged to the ground via the flag memory cell 5. Therefore, the electrical potentials of the flag bit lines BL1–BL7 remain at H level, which means that the information "1" is read to the flag bit line BL.

The column decoder 26 receives the column address signals Y0–Y2, and outputs the bit line selecting signals B0–B7, based on the column address signals Y0–Y2, to the signal lines SL0–SL7. In this manner, one of the signal lines SL0–SL7 is selected, and its electrical potential is raised to H level. The rest of the signal lines remains at L level (see FIGS. 3B–3E).

In the respective bit line selecting portions 13(0)–13(31) of the bit line selector 13, the selecting transistors of 14(0)–14(7) connected to the selected signal lines SL become conductive. The rest of the selecting transistors remains nonconductive.

In the respective upper bit line groups 7(0)–7(31), the bit lines connected to the selected transistors are connected to the corresponding first common nodes 18(0)–18(31) in the respective bit line selecting portions 13(0)–13(31).

The electrical potentials of the respective first common nodes 18(0)–18(31) are raised to the electrical potential of the bit line BL via a conductive selecting transistor in the plurality of the selecting transistors 14(0)–14(7). That is, if the electrical potentials of the bit lines BL0–BL7 are at L level, the electrical potentials of the first common nodes 18(0)–18(31) are discharged to L level via the bit selecting transistors 14(0)–14(7), the bit line BL, and the memory cells 2. If the electrical potentials of the bit lines BL1–BL7 are at H level, the electrical potentials of the first common nodes 18(0)–18(31) maintain the pre-charge electrical potential, that is, H level.

As a result, all the bit lines BL0–BL7, which are arranged corresponding columns of the memory cells 2 in the respective memory cell groups 3(1)–3(31), are selected, and the information for one word stored in the memory cells 2, is read to the first common node 18(0)–18(31).

The electrical potential, that is, information based on the electrical potential of the first common nodes 18(0)–18(31), appears on the signal lines 19(0)–19(31) via the buffers 15(0)–15(31).

The information appearing on these signal lines 19(0)–19(31) is information stored in one memory cell in the memory cell groups 3 selected by the row address signals X0–X6 and the column address signals Y0–Y2, that is, one word (32 bits) write data.

Alternatively, in the flag selection selector 20, the selecting transistors 21(0)–21(7) connected to the selected signal lines SL0–SL7 become conductive, and the rest of the selecting transistors remains non-conductive.

In the flag bit line group 8, the flag bit lines BL0–BL7 connected to the conductive selecting transistors are connected to the second common terminal 24.

The electrical potential of the second common terminal 24 is raised to the electrical potential of the flag bit line connected to the conductive selecting transistor 21. That is, if the electrical potentials of the flag bit lines BL0–BL7 are at L level, the electrical potential of the second common node 24 is discharged to L level via the selecting transistors 21(0)–21(7), the flag bit lines BL0–BL7, and the flag memory cells 5. If the electrical potentials of the flag bit lines BL0–BL7 are H level, the second common node 24 maintains the pre-charged potential, that is, H level. Therefore, the electrical potential, that is, the information based on the electrical potential of the second common node 24, appears on the signal line 25 via the inverter 22.

The information appearing on the signal line 25 indicates whether the one word write data (32 bits) of the memory cell array 1, selected by the row address signals X0–X6 and the column address signals Y0–Y2, are inverted.

The information appearing on the signal lines 19(0)–19(31) and on the signal line 25 are input to the output circuit 27. The respective output portions 28(0)–28(31) of the output circuit 27 carry out an exclusive logical sum on the information input from the corresponding signal lines 19(0)–19(31) and the signal line 25, and output the results to the corresponding data output lines DL0–DL7 as read data. That is, if the information input from the signal line 25 is "1" (if the information stored in the flag memory cells 5 is "0"), the information input from the signal lines 19(0)–19(31) is the data to be inversely read. Therefore, the information from the signal lines 19(0)–19(31) are inverted and output to the output lines DL0–DL31. If the information input from the signal line 25 is "0" (if the information stored in the flag memory cells 5 are "1"), the information input from the signal lines 19(0)–19(31) is data to be read without being inverted. Therefore, the information input from the signal lines 19(0)–19(31) are output to the output lines DL0–DL31 without being inverted.

Therefore, the information appearing on the data output lines DL0–DL31 is one word (32 bits) of read data from the respective memory cell groups 3(0)–3(31) selected by the row address signals X0–X6 and the column address signals Y0–Y2. In this manner, data are read from the memory cell array 1 for every word.

After the data read period has been terminated, the pre-charge period begins again. The memory cells 2 in which the information "0" is stored are connected to the selected word line, and the bit line which has been discharged to L level is pre-charged, again to H level, by the pre-charger 10. The flag bit line BL, connected to the flag memory cells 5 in which the information "0" is stored, and has been discharged to L level is pre-charged again to H level by the second pre-charger 11.

In the bit selector 13, the first common nodes 18(0)–18(31) connected to bit line BL, which are discharged to L level, are pre-charged to H level by the pre-charge transistors 16(0)–16(31). The second common node 24 connected to the flag bit line BL discharged to L level in the flag bit selector 20 is pre-charged to H level by the pre-charge transistor 23.

In this manner, after the pre-charge period is terminated, the same reading operation is repeated in the next read period, based on the succeeding row address signals X0–X6 and column address signals Y0–Y2. These pre-charge period and the read period are repeated thereafter.

In the read only semiconductor memory device, a determination as to whether the data stored in the memory cells 5 must be inverted for each word. In other words, if the number of "0"'s exceeds the number of "1"'s in a word, the data are inverted and stored in the memory cells 5. When reading the stored data, the stored data are output by inverting or not inverting based on the flag information (flag bits) stored in the flag memory cells 5 in the flag memory cell group 4. Accordingly, it is possible to reduce power consumption.

Regarding the reduction of power consumption, further explanation is added below using a specific example. For the sake of simplicity and clarity of the explanation, it is assumed that one word comprises 10 bits, although it comprises 32 bits in the embodiment described above.

FIG. 4 shows data to be stored and the data for seven words written into the memory cells 2. As being obvious from FIG. 4, if the data containing more "0"'s than "1"'s are inverted and written in the memory cells 2, the number of the information "0"'s stored in the memory cells 2 is reduced from 38 to 22 (approximately 30 percent reduction). Considering this fact, it is easily understood that the large number of the memory cells 2 of 8×128 words (32 bits/word) in which information "0" is written is significantly reduced. The larger the storage capacity of the memory device, the larger the reduction in the number of memory cells 2 in which the information "0" is stored, which has the advantageous effect of reducing power consumption.

In addition, in the read only semiconductor memory device, since the output portions 28(0)–28(31) are provided for the corresponding memory cell groups 3(0)–3(31), it is possible to reduce the size of the surrounding circuit except for the memory cell arrays 1. Moreover, since the output portions 28(0)–28(31) are provided only for every respective memory cell group 3(0)–3(31), it is possible to arrange the output portions 28(0)–28(31) in parallel with the word lines WL0–WL127 along a straight line, which facilitates high density circuit integration. It is also possible to arrange the bit line selecting portions 13(0)–13(31) in the bit line selector 13 for every memory cell group 3(0)–3(31), and to arrange the bit line selecting portions 13(0)–13(31) and the flag bit line selector 20 in parallel with the word lines WL0–WL127 on along a straight line, which also facilitates high density integration of the memory circuit.

In summary, in the read only semiconductor memory device according to the invention, it is possible to reduce circuit size, to facilitate the high density circuit integration, and to reduce power consumption.

Embodiment 2.

Figure 5:
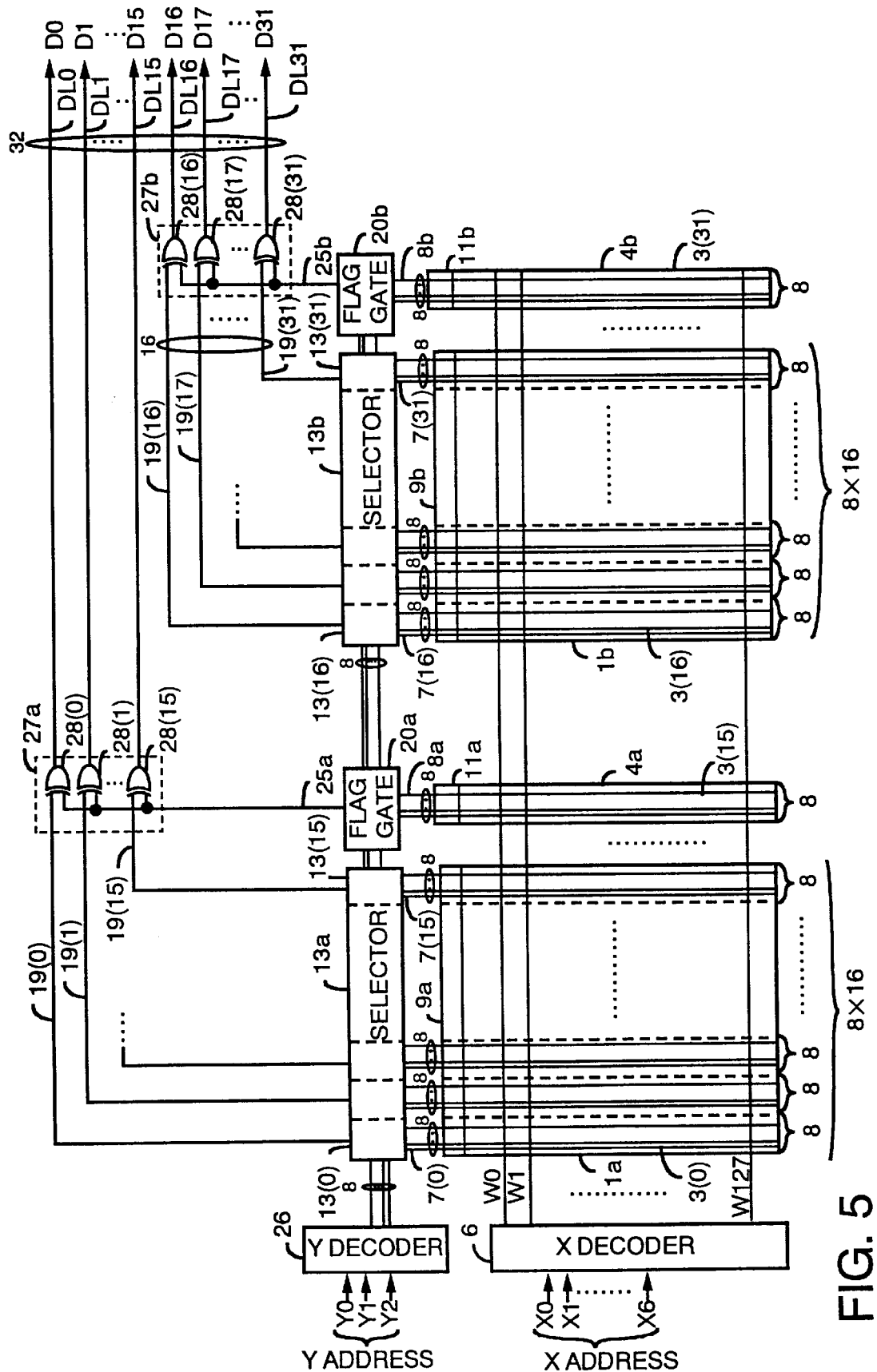
FIG. 5 shows a circuit according to a second embodiment of the present invention.

FIG. 5 shows a second embodiment of the present invention. In the first embodiment, one flag memory cell 5 is provided for each word (32 bits), and the data to be stored (write data) in the memory cells 2 are determined to be inverted, or not, for every word. However, in this second embodiment, each word (32 bits) is divided into upper bits (16 bits) and lower bits (16 bits), and flag memory cells 5 are provided for the respective upper and lower bits. In this case, respective upper and lower bits for each word (32 bits) are determined to be inverted or not. The second embodiment is only different in this point from the first embodiment.

Therefore, the second embodiment is explained below, focusing on this difference. In FIG. 5, the same components as those shown in FIG. 1 and FIG. 2 are represented by the same numbers, so that description of these elements is omitted.

The circuit of FIG. 5 comprises an upper memory cell array 1a for the upper bits and a lower memory cell array 1b for the lower bits. The upper memory cell array 1a is an aggregation of the memory cells 2 for storing the upper bits of the words, and comprises memory cell groups 3(0)–3(15). The lower memory cell array 1b is an aggregation of the memory cells 2 for storing the lower bits of the words, and comprises memory cell groups 3(16)–3(31).

An upper flag memory cell group 4a corresponds to the upper memory cell array 1a. The upper flag memory cell group 4a consists of a plurality of flag memory cells 5 arranged in a plurality of rows and columns, which are the same as those of the respective memory cell groups 3(0)–3 (15). The respective flag memory cells 5 store information "0" or "1" which indicates whether the information stored in the corresponding memory cells 2 in the respective memory cell groups 3(0)–2(15) are to be inverted or not. The lower flag memory cell group 4b corresponds to the lower memory cell array 1b. The lower flag memory cell group 4b consists of a plurality of flag memory cells 5 arranged in a plurality of rows and columns, which are the same as those of the respective memory cell groups 3(16)–3(31). The respective flag memory cells 5 store information "0" or "1" which indicates whether the information stored in the corresponding memory cells 2 in the respective memory cell groups 3(16)–2(31) are to be inverted or not.

A plurality of upper bit line groups 7(0)–7(15) correspond to the upper memory cell array 1a. A plurality of lower bit line groups 7(16)–7(31) corresponds to the lower memory cell array 1b. an upper flag bit line group 8a corresponds to the upper flag memory cell group 4a and comprises a plurality of flag bit lines BL0–BL7. A lower flag bit line group 8b corresponds to the lower flag memory cell group 4b, and also comprises a plurality of flag bit lines BL0–BL7. An upper first pre-charger 9a corresponds to the upper memory cell array 1a, and a lower first pre-charger 9b corresponds to the lower memory cell array 1b. An upper second pre-charger 11a corresponds to the upper memory cell array 1a, and a lower second pre-charger 11b corresponds to the lower memory cell array 1b.

An upper bit line selector 13a corresponds to the upper bit line groups 7(0)–7(15) and comprises upper bit line selecting portions 13(0)–13(15). A lower bit line selector 13b corresponds to the lower bit line groups 7(16)–7(31) and comprises lower bit line selecting portions 13(16)–13(31). An upper flag bit line selector (flag gate) 20a selects one of the flag bit lines BL0–BL7 in the upper flag bit line group 8a. A lower flag bit line selector (flag gate) 20b selects one of the flag bit lines BL0–BL7 in the lower flag bit line group 8a.

An upper output circuit 27a corresponds to the upper bit line selecting portions 13(0)–13(15) in the upper bit line selector 13a and comprises output portions 28(0)–28(15). The output portions 28(0)–28(15) comprise exclusive logical sum circuits (EX-OR circuits). The first input terminals of the respective output portions 28(0)–28(25) are connected to the upper signal lines 19(0)–19(15), which are connected to the corresponding upper bit line selecting portions 13(0) –13(15). The second input terminals of the respective output portions 28(0)–28(15) are connected to the upper signal line 25a of the upper flag bit line selecting portion 20a. The output terminal of the respective output portions 28(0)–28 (15) are connected to the data output lines DL0–DL15.

A lower output circuit 27b corresponds to the lower bit line selecting portions 13(16)–13(31) and comprises the output portions 28(16)–28(31). The respective output portions comprise exclusive logical sum circuits (EX-OR circuits). The first input terminals of the respective output portions 28(16)–28(31) are connected to the signal lines 19(16)–19(31), which are connected to the corresponding lower bit line selecting portions 13(16)–13(31). The second input terminals of the respective output portions 28(16)–28 (31) are connected to the lower signal line 25b of the lower flag bit line selecting portion 20b. The output terminal of the respective output portions 28(16)–28(31) are connected the data output lines DL16–DL31.

Although the memory cell array 1 is divided into the upper memory cell array 1a and the lower memory cell array 1b in the second embodiment, its operation is the same as that of the first embodiment in that the information stored in the memory cells 2 is read according to the row address signals X0–X6 and the column address signals Y0–Y2, and the information read from the memory cells 2 appears on the signal lines 19(0)–19(31).

In addition, the operation of circuit of the second embodiment is the same as that of the first embodiment in that the information stored in flag memory cells 5 is read according to the row address signals X0–X6 and the column address signals Y0–Y2, and the information read from flag memory cells 5 appears on the upper signal line 25*a* and the lower signal line 25*b*.

The information appearing on the upper signal lines 19(0)–19(15) and the information appearing on the upper signal line 25*a* are input to the upper output circuit 27*a*. The information appearing on the signal lines 19(16)–19(31) and the information appearing on the lower signal line 25*b* are input to the lower output circuit 27*b*. The respective output portions 28(0)–28(31) in the upper output circuits 27*a* and lower output circuits 27*b* carry out the exclusive logical sum on the data input from the corresponding signal lines 19(0)–19(31) and the signal lines 25*a* and 25*b*, in the same manner as in the first embodiment, and output the results of the exclusive logical sum to the corresponding data output lines DL0–DL31 as read data.

The information which appears on the data output lines DL0–DL31 corresponds to the information in memory cells 2 in the respective memory cell groups 3(0)–3(31) selected according to the row address signals X0–X6 and the column address signals Y0–Y2; that is, this information corresponds to one word (32 bits) of the read data (data to be stored).

In this manner, the data are read from the memory cell arrays 1*a* and 1*b* for every word. After the read period has been terminated, the pre-charge period starts again, in the same manner as that of the first embodiment, and a similar pre-charge operation is carried out.

The read only semiconductor memory device of the second embodiment further reduces power consumption when the upper and the lower bits have a specific feature, such as in an instruction ROM where the upper bits store instructions and the lower bits store addresses.

Regarding the reduction of power consumption, further explanation is added below using a simple specific example. For the sake of simplicity and clarity of explanation, it is assumed in the second embodiment that one word comprises 14 bits, instead of 32 bits, just to explain how power consumption is reduced.

FIG. 6 shows the data to be stored and the data written into the memory cells 2 for 7 words. As obvious from FIG. 6, if the data containing more "0" 's than "1" 's are inverted and written in the memory cells 2, the number of the information "0" 's stored in the memory cells 2 is reduced from 41 to 29 (approximately 30 percent reduction). This reduction shown in FIG. 6 is advantageous when more information "0" 's are included in the upper bits and more information "1" 's are included in the lower bits.
Embodiment 3.

Figure 7:
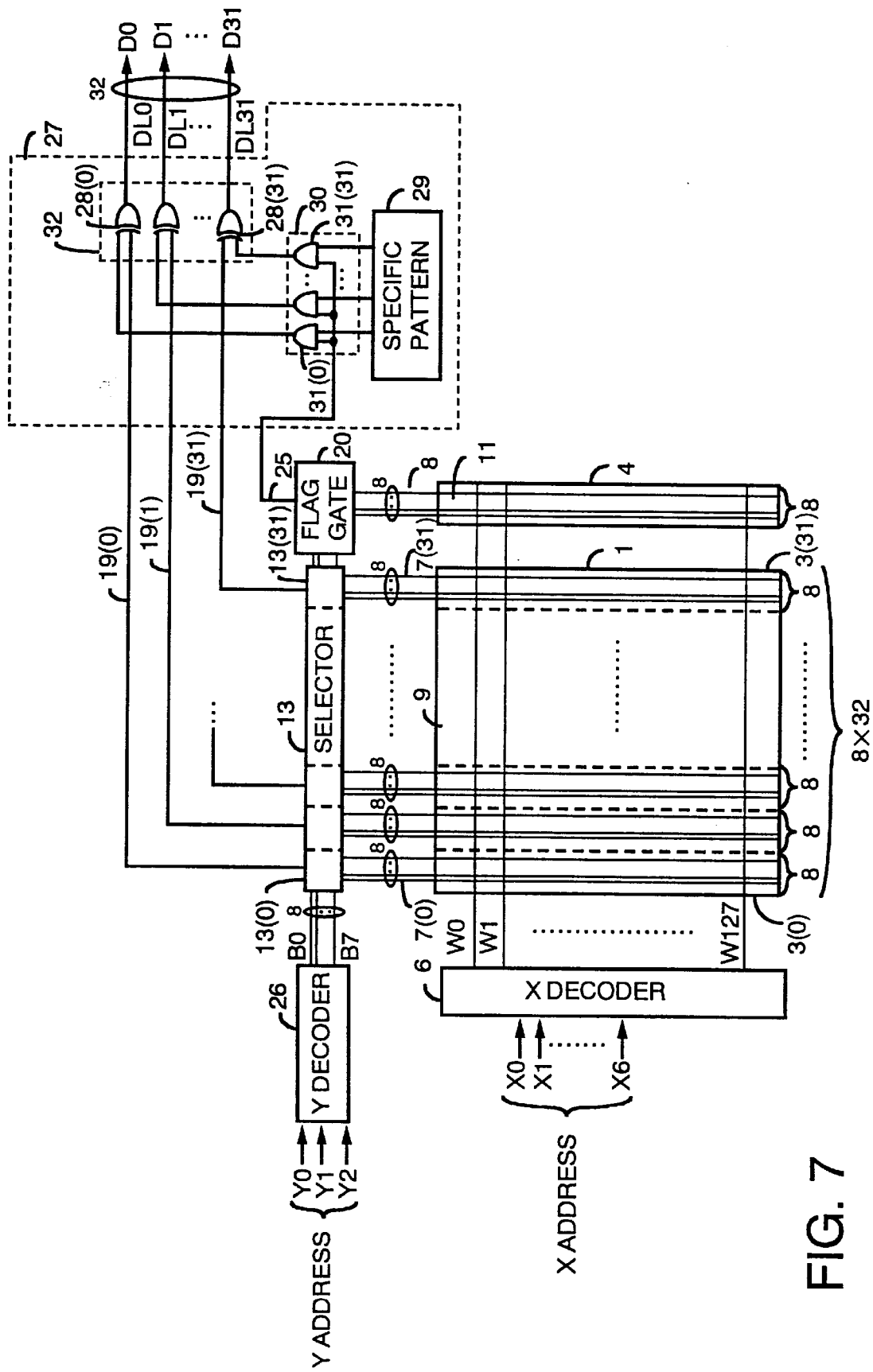
FIG. 7 shows a circuit according to a third embodiment of the present invention.

FIG. 7 shows a third embodiment of the present invention. In the first embodiment, the memory cells 2 store the inverted information when the number of information "0" 's exceeds the number of information "1" 's in a word, and stores the non-inverted information when the number of the information "1" 's exceeds the number of information "0" 's in a word. However, in the third embodiment, a converted information and non-converted information are stored in a specific pattern memory 29, instead of the inverted and non-inverted information of the first embodiment. The third embodiment is only different in this point from the first embodiment. Therefore, the third embodiment is explained below focusing on this difference. In FIG. 7, the same components as those shown in FIG. 1 and FIG. 2 are represented by the same numbers, so that repeated description of those elements is omitted In FIG. 7, the memory cells 2 in the memory cell array 1 store the data for every word based on the following rules. The exclusive logical sum operation is carried out on the word data to be stored (referred to as non-converted data below) and a specific pattern to obtain the results (referred to as post-converted data). Then, the number of "0" 's contained in the non-converted data and in the post-converted data are compared, and the one with fewer "0" 's is stored in the memory cells 2.

The flag memory cells 5 in the flag memory cell group 4 store the information "0" or "1", which indicates whether the corresponding word stored in the memory cell array 1 needs to be converted or not.

The output circuit 27 carries out the exclusive logical sum between the specific pattern, and the information appearing on the flag bit lines BL0–BL7 selected by the flag bit line selector 20 and on the bit lines BL0–BL7 selected by the bit line selector 13(0)–13(31), and outputs the result, or the output circuit 27 outputs the information appearing on the bit lines BL0–BL7 selected by the bit line selector 13(0)–13(31) without carrying out the exclusive logical sum. The output circuit 27 comprises a specific pattern memory 29, a pattern switch 30, and an output circuit 27.

The specific pattern memory 29 stores a specific pattern having the same number as the number of the columns of the memory cell groups 3(0)–3(31) (in the third embodiment, this number is 32). In the specific pattern memory 29, the memory portion for storing "0" corresponds to a ground potential node, and the memory portion for storing "1" corresponds to a power source potential node.

The pattern switch 30 receives the information appearing on the selected flag bit lines BL0–BL7 selected by the flag bit selector 20. When the received information indicates converted information, the pattern switch 30 outputs the specific pattern, and when the received information shows non-converted information, the pattern switch 30 outputs the non-specific pattern, that is, all "0" 's, for example. The pattern switch 30 comprises AND circuits 31(0)–31(31), equal in number to the columns of the memory cell groups 3(0)–3(31). One input terminal of the respective AND circuits 31(0)–31(31) is connected to the signal line 25 for receiving the information stored in the selected flag memory cell 5. The other input terminal of the respective AND circuits 31(0)–31(31) is connected to the corresponding memory in the specific pattern memory 29 for receiving the bit information of the corresponding specific pattern.

The output circuit 27 comprises output portions 28(0)–28(31), which correspond to the respective bit line selecting portions 13(0)–13(31). One input terminal of each of the respective output portions 28(0)–28(31) is connected to the corresponding signal lines 19(0)–19(31), and receives the information which appears on the bit lines BL0–BL7 selected by the bit selecting portions 13(0)–13(31). The other input terminals of the respective output portions 28(0)–28(31) are connected to the corresponding outputs of the pattern switch 30. The respective output portions 28(0)–28(31) comprise exclusive logical sum circuits (EX-OR circuit) for inverting or not inverting the information received from the respective bit selecting portions 13(0)–13(31), based on information input from the pattern switch 30.

The specific pattern stored in the specific pattern memory 29 is determined in the manner explained below. The specific pattern memory 29 stores the most frequently appearing patterns which exist in the memory cell array 1 for every word.

In this case, the data to be stored in the memory cell array 1 and the bit information to be stored in the flag bit line group 4 become as follows. Since the exclusive logical sum is carried out between the data to be stored and the specific pattern, the specific pattern becomes all "1" 's. The flag bit line group 4 stores the corresponding information "0", which indicates that the stored data has been converted.

For the data to be stored for the rest of the words, the exclusive logical sum is carried out between the data to be stored and the specific pattern, and the post-converted information is obtained. The number of "0" 's in the respective post-converted information and the data to be stored (non-converted information) are compared, and the data with fewer "0" 's are stored in the memory cell groups 3(0)–3 (31). If the post-converted data are stored in the memory cell groups 3(0)–3(31), the corresponding flag memory cell 5 of the flag memory cell group 4 stores an information "0". If non-converted data are stored in the memory cell groups 3(0)–3 (31), the corresponding flag memory cell 5 stores the information "1".

The specific pattern is easily defined by finding the most frequently stored pattern in the memory cell array. The specific pattern effectively reduces the number of the information "0" 's stored in the memory cells 2.

There are two other ways to determine the specific pattern. In the same manner as in the first method explained above, all patterns of the data to be stored in the memory cell array 1 are investigated in the second method. Then, the most frequently appearing K (for example, 100) patterns are selected. For every selected K pattern, the following operation is carried out to obtain the information "0" to be stored in the memory cell array 1. The exclusive logical sum is carried out between the selected K patterns and the data to be stored. Then, the number of "0" 's included in the post-converted data and those of the data to be stored (non-converted original data) are compared, and the data having fewer "0" 's are determined to be write data. This process is carried out for all words to be stored. The number of "0" 's contained in the write data of all the words (for, example, 1024 (=8×128)) are obtained, that is, the number of the information "0" 's contained in the data to be stored in the memory cell array 1 is obtained. This operation is carried out for all K patterns. From the investigation of all K patterns, the write data having the least total number of the information "0" 's is determined to be a specific pattern. After the specific pattern is obtained, the data to be stored in the memory cell array 1 and in the flag memory cell group 4 are obtained in the same manner as that in the first method discussed above. According to this second method, it is possible to reduce the number of the information "0" 's which are stored in the memory cell array 1.

In the third method to determine the specific pattern, operation of the exclusive logical sums is carried out between the respective (2n−1) ("n" equals the number of bits in one word; for example, 32) patterns and the data to be stored in the memory cell array 1 to obtain the number of information "0" 's. Then, the number of "0" 's included in the post-converted data and the data to be stored (non-converted data) are compared, and the data with fewer "0" 's are stored in the memory cell array 1. This process is carried out on all words to be stored to obtain the number of "0" 's contained in the write data in the memory array 1. From the (2n−1) patterns, the pattern corresponding to the write data with the least total number of the information "0" 's is determined to be a specific pattern. After the specific pattern is determined, the data to be stored in the memory cell array 1 and bit information of the specific pattern to be stored in the flag memory cell group 4 are obtained in the same manner as in the first method discussed above. According to this third method, it is possible to reduce the number of the information "0" 's stored in the memory cell array 1.

The operation is the same as that of the first embodiment in that the information stored in the memory cells 2 is read according to the row address signals X0–X6 and the column address signals Y0–Y2, and the information read from the memory cells 2 appears on the signal lines 19(0)–19(31).

The operation of the described device is also exactly the same as in the first embodiment in that the information stored in flag memory cells 5 is read according to the row address signals X0–X6 and the column address signals Y0–Y2, and the information read from flag memory cells 5 appears on the signal line 25.

Then, the output circuit 27 receives the information appearing on the signal lines 19(0)–19(31) and the information appearing on the signal line 25. The pattern switch 30 provides the patterns stored in the specific pattern memory 29 or all "0" 's pattern to the output circuit 27 to the output circuit 27, based on the information input from the signal line 25. The respective output portions 28(0)–28(31) in the output circuit 27 carry out the exclusive logical sum between the information from the corresponding signal lines 19(0) –19(31) and the bit information corresponding to the patterns output from the pattern switch 30, that is, the information from the corresponding AND circuits 31(0)–31(31) in the pattern switch 30. Then, the results are output to the corresponding data output lines DL0–DL31 as read data.

Therefore, the information which appears on the data output lines DL0–DL31 corresponds to the information of memory cells 2 in the respective memory cell groups 3(0)–3(31) selected according to the row address signals X0–X6 and the column address signals Y0–Y2, that is, this information corresponds to one word (32 bits) of the read data (data to be stored).

In this manner, the data are read from the memory cell array 1 for every word. After the read period has been terminated, the pre-charge period starts again, in the same manner as that of the first embodiment, and a similar pre-charge operation is carried out.

In the read only semiconductor memory device according to the third embodiment, whether the data are converted based on the specific pattern or not converted is stored in the memory cells 5 for every word. When reading the data, the exclusive logical sum is carried out between the read data and the specific pattern or the read data are output without carrying out the exclusive logical sum, based on the flag information (flag bit) stored in the flag memory cells 5. In this manner, the number of information "0" 's to be stored in the memory cells of the memory cell array 1 can be efficiently reduced, which also reduces power consumption.

Regarding the reduction of power consumption, further explanation is added below using a simple specific example. For the sake of simplicity and clarity of the explanation, it is assumed in the third embodiment that one word comprises 14 bits, instead of 32 bits, just to explain how power consumption is reduced. FIG. 8 shows the data to be stored and the data written into the memory cells 2 for 7 words.

As obvious from FIG. 8, if the data to be stored is the same as the specific pattern, all "1" data are written into the memory cells 2. If the exclusive logical sum operation is carried out on the word data to be stored and a specific pattern, the number of the information "0" is reduced from 45 to 23 (approximately 45 percent reduction) in comparison with a case of no operation.

This result shows that the number of information "0" 's stored in the memory cells 2 is greatly reduced in the third embodiment which includes 8×127 words (32 bits/word). The greater the capacity, the fewer the information "0" 's stored in the memory cells 2, and this has the advantageous effect of reducing power consumption.

Moreover, with the invention according to the third embodiment, it is possible to reduce the circuit size, and to facilitate the high density integration of the circuit in the same manner as that in the first embodiment. That is, since the output portions 28(0)–28(31) and the AND circuits 31(0)–31(31) in the pattern switch 30 correspond to the respective memory cell groups 31(0)–3(31), it is possible to reduce the size of the surrounding circuit except for the memory cell array 1. In addition, since the output portions 28(0)–28(31) and the AND circuits 31(0)–31(31) can be arranged for the respective memory cell groups 3(0)–3(31), it is possible to arrange the output portions 28(0)–28(31) and the AND circuits 31(0)–31(31) in parallel with the word lines WL0–WL127 along a straight line, which facilitates the high density integration of the memory circuit. The specific patten memory 29 does not occupy a large area, since the respective memories in the specific pattern memory 29 can be constructed with only a power source potential node or a ground potential node in the pattern switch 30.

Embodiment 4.

Figure 9:
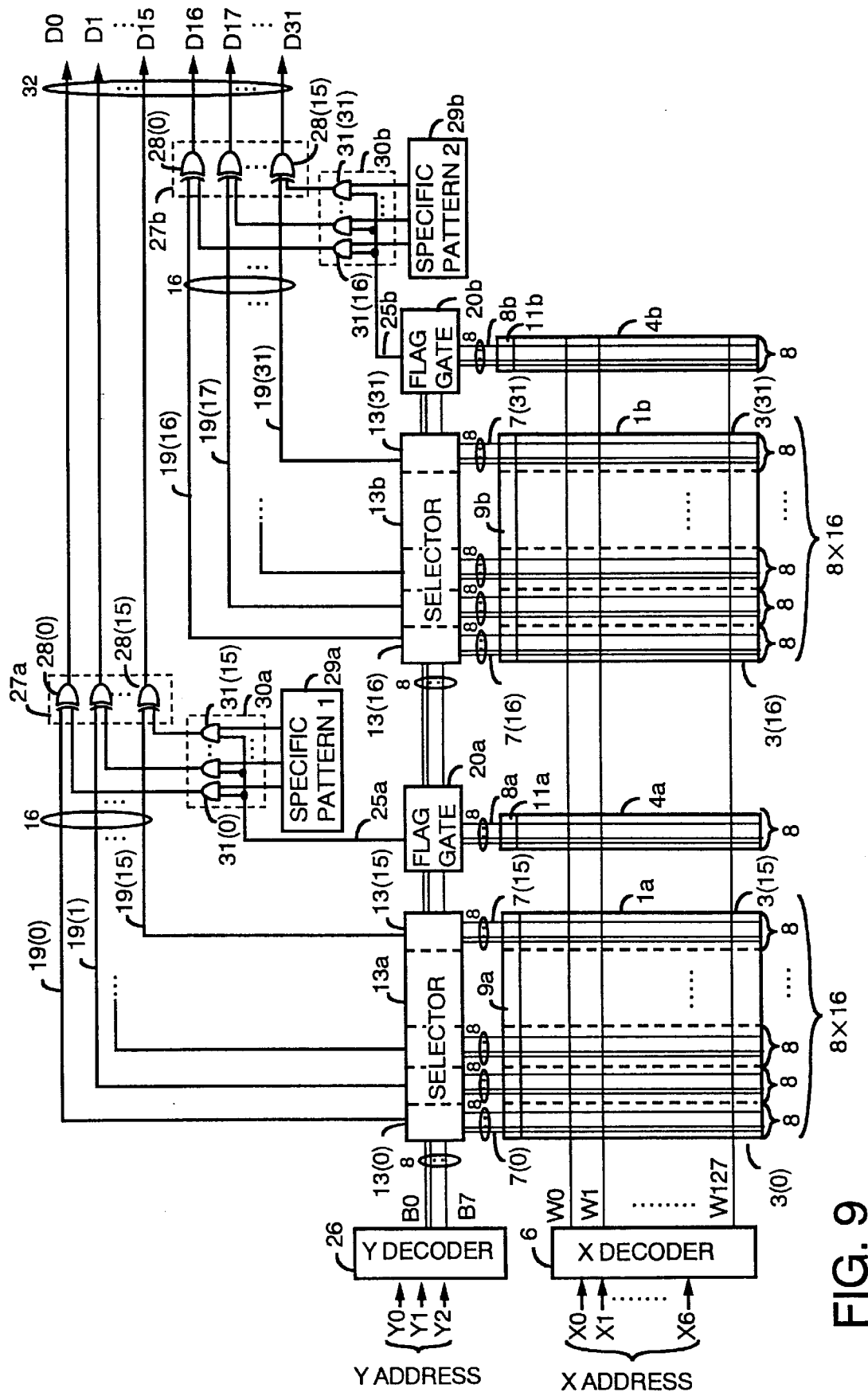
FIG. 9 shows a circuit according to a fourth embodiment of the present invention.

FIG. 9 shows a fourth embodiment of the present invention. In the third embodiment, one flag memory cell 5 is arranged for each word (32 bits), and the data to be stored (write data) in the memory cells 2 are determined to be converted or not for every word. However, in this fourth embodiment, each word is divided into upper bits (16 bits) and the lower bits (16 bits), and the flag memory cells 5 are provided for the respective upper and the lower bits. In this case each of the upper bits (16 bits) are determined to be converted or not according to the first specific pattern and the lower bits (16 bits) are determined to be converted or not according to the second specific pattern. The fourth embodiment is different only in this point from the third embodiment.

The relationship of the fourth embodiment and the third embodiment is the same as that of the second embodiment and the first embodiment. Therefore, it seems easy to understand the fourth embodiment without specific detailed explanation. Thus, the fourth embodiment is briefly explained below. In FIG. 9, the same components as those shown in FIG. 1 and FIG. 2 are represented by the same numbers, so that repeated description of them is omitted. The affix "a" represents the upper bit circuits, and affix "b" represents the lower circuits.

The first specific pattern corresponding to the upper 16 bits of a word is stored in the specific pattern memory 29a corresponding to the upper memory cell array 1a. The first specific pattern is determined according to the first to the third method as explained for the third embodiment, based on all words stored in the upper memory cell array 1a.

The second specific pattern corresponding to the lower 16 bits of one word is stored in the specific pattern memory 29b corresponding to the lower memory cell array 1b. The second specific pattern is determined according to the first to the third methods as explained for the third embodiment, based on all words stored in the lower memory cell array 1b. In this manner, the most appropriate first specific pattern and the second specific pattern are set for the upper memory cell array 1a and the lower memory cell array 1b.

Although the memory cell array 1 is divided into the upper memory cell array 1a and the lower memory cell array 1b in the fourth embodiment, its operation is the same as that of the third embodiment in that the information stored in the memory cells 2 is read according to the row address signals X0–X6 and the column address signals Y0–Y2, and the information read from the memory cells 2 appears on the signal lines 19(0)–19(31).

In addition, the operation of the circuit according to the fourth embodiment is similar to that of the third embodiment in that the information stored in flag memory cells 5 is read according to the row address signals X0–X6 and the column address signals Y0–Y2, and the information read from flag memory cells 5 appears on the upper signal line 25a and the lower signal line 25b.

The information appearing on the upper signal lines 19(0)–19(15) and the information appearing on the upper signal line 25a are input to the upper output circuit 27a. The information appearing on the signal lines 19(16)–19(31) and the information appearing on the lower signal line 25b are input to the lower output circuit 27b.

In the upper output circuit 27a, the pattern switch 30a provides the pattern stored in the specific pattern memory 29a or an all "0" pattern to the output circuit 27a, based on the information input from the upper signal line 25a. The respective output portions 28(0)–28(15) in the output circuit 27a carry out the exclusive logical sum between the information from the corresponding signal lines 19(0)–19(31) and the bit information corresponding to the patterns output from the pattern switch 30a, that is, the information from the corresponding AND circuits 31(0)–31(15) in the pattern switch 30a. Then, the results are output to the corresponding data output lines DL0–DL15 as read data.

In the lower output circuit 27b, the pattern switch 30b provides the pattern stored in the specific pattern memory 29b or an all "0" pattern to the output circuit 27b, based on the information input from the upper signal line 25a. The respective output portions 28(16)–28(31) in the output circuit 27b carry out the exclusive logical sum between the information from the corresponding signal lines 19(0)–19(31) and the bit information corresponding to the patterns output from the pattern switch 30b, that is, the information from the corresponding AND circuits 31(16)–31(31) in the pattern switch 30b. Then the results are output to the corresponding data output lines DL16–DL31 as read data.

Therefore, the information which appear on the data output lines DL0–DL31 corresponds to the information of memory cells 2 in the respective memory cell groups 3(0)–3(31) selected according to the row address signals X0–X6 and the column address signals Y0–Y2, that is, this information corresponds to one word (32 bits) of the read data (data to be stored).

In this manner, data are read from the memory cell array 1 for every word. After the read period has been terminated, the pre-charge period starts again, in the same manner as that of the third embodiment, and a similar pre-charge operation is carried out.

The read only semiconductor memory device of the fourth embodiment further reduces power consumption when the upper and the lower bits have specific features, such as an instruction ROM where the upper bits store instructions and the lower bits store addresses.

Embodiment 5.

Figure 10:
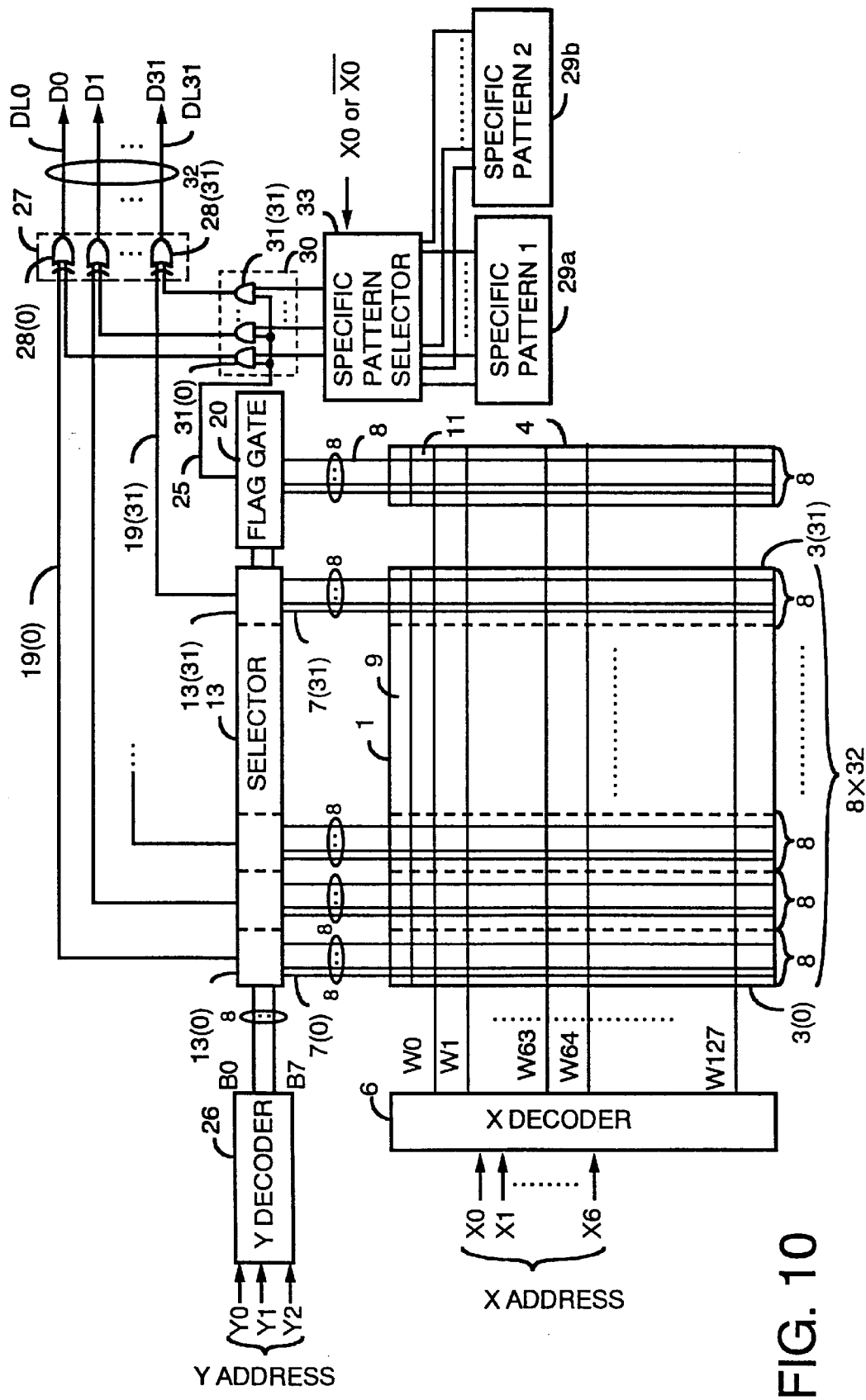
FIG. 10 shows a circuit according to a fifth embodiment of the present invention.

FIG. 10 shows a fifth embodiment of the present invention. In the third embodiment, one specific pattern is determined for the entire memory cell array 1, and the post-converted data or not-converted data are stored (written) for every word of the memory cells 2, based on the specific pattern. In the fifth embodiment, however, the memory cell array 1 is divided into a first array 1A which includes line 0 to line 63, and into a second array 1B which includes the line 64 to the line 12. The first specific pattern is determined for the first array 1A and the second specific pattern is determined for the second array 1B. It is determined whether the post-converted data or non-converted data are to be stored (written) in the memory cells 2 of the respective arrays 1A and 1B, based on the first and the second specific pattern. The fifth embodiment is only different in this point from the third embodiment.

Therefore, the fifth embodiment is explained below, focusing on this difference. In FIG. 10, the same components as those shown in FIG. 7 are represented by the same numbers, so that the description is omitted.

In the circuit of FIG. 7, the output circuit 27 comprises first and second pattern memories 29a and 29b, a pattern selector 33, a pattern switch 30, and an output circuit 27.

The first specific pattern memory 29a corresponds to the first array 1A in the memory cell array 1, and stores the first specific pattern having the same number of bits (in this fifth embodiment, 32 bits) as that of the columns of the memory cell groups 3(0)–3(31).

The second specific pattern memory 29b corresponds to the second array 1B in the memory cell array 1, and stores the second specific pattern having the same number of bits as that of the columns of the memory cell groups 3(0)–3(31). In the respective specific pattern memories 29a and 29b, the information "0" corresponds to the ground potential node, and the information "1" corresponds to the power potential node.

The first specific pattern to be stored in the first specific pattern memory 29a is determined by the first to the third methods explained above for the third embodiment, based on all words stored in the first array 1A. The second specific pattern to be stored in the first specific pattern memory 29b is determined by the first to the third methods explained for the third embodiment, based on all words stored in the second array 1B. In this manner, the most appropriate first and the second specific patterns are set for the first array 1A and the second array 1B.

In the fifth embodiment, the pattern selector 33 selects the first or the second specific pattern based on row address signals, i.e.) based on the most significant row address signals X0. The pattern selector 33 comprises two MOS transistors having a gate electrode receiving the inverted or non-inverted signal of the most significant row address signal X0 for every bit of the specific pattern.

The pattern switch 30 receives the information appearing on the flag bit lines BL0–BL7 selected by the flag bit line selector 20. When the received information shows converted information, the pattern switch 30 outputs the specific pattern selected by the pattern selector 33. When the received information shows non-converted information, the pattern switch 30 outputs a non-specific pattern consisting of all "0"'s in the fifth embodiment. The pattern switch 30 has the same construction as that in the third embodiment explained above.

The output circuit 27 comprises output portions 28(0)–28(31) corresponding to the plurality of bit line selecting portions 13(0)–13(31). The respective output portions 28(0)–28(31) have the same construction as that in the third embodiment explained above.

Although the memory cell array 1 is divided into two portions along the row direction, its operation is the same as that of the third embodiment in that the information stored in the memory cells 2 is read according to the row address signals X0–X6 and the column address signals Y0–Y2, and the information read from the memory cells 2 appears on the signal lines 19(0)–19(31).

In addition, the operation of circuit of the fifth embodiment is similar to that of the third embodiment in that the information stored in flag memory cells 5 is read according to the row address signals X0–X6 and the column address signals Y0–Y2, and the information read from flag memory cells 5 appears on the upper signal line 25.

The information appearing on the signal lines 19(0)–19(31) and the information appearing on the signal line 25 is input to the output circuit 27. The pattern selector 33 determines whether the first array 1A or the second array 1B is selected by the row address signals X0–X6, and outputs one of the first and the second specific pattern from the specific pattern memories 29a and 29b to the pattern switch 30.

The pattern switch 30 provides one of the first and second specific patterns selected and or an all "0" pattern to the input terminals of the output circuit 27. The respective output portions 28(0)–28(31) carry out the exclusive logical sum between the information input from the signal lines 19(0)–19(31) and the bit information corresponding to the pattern output from the pattern switch 30, that is, the information output from the corresponding AND circuits 31(0)–31(31). Then, the results are output to the corresponding data output lines DL1–DL31 as read data.

Therefore, the information which appears on the data output lines DL0–DL31 corresponds to the information of memory cells 2 in the respective memory cell groups 3(0)–3(31) selected according to the row address signals X0–X6 and the column address signals Y0–Y2, that is, this information corresponds to one word (32 bits) of the read data (data to be stored).

In this manner, the data are read from the memory cell arrays 1A and 1B for every word. After the read period has been terminated, the pre-charge period starts again, in the same manner as that of the third embodiment, and a similar pre-charge operation is carried out.

Therefore, the information which appears on the data output lines DL0–DL31 corresponds to the information of memory cells 2 in the respective memory cell groups 3(0)–3(31) selected according to the row address signals X0–X6 and the column address signals Y0–Y2, that is, this information corresponds to one word (32 bits) of the read data (data to be stored).

In this manner, the data are read from the memory cell array 1 for every word. After the read period has been terminated, the pre-charge period starts again, in the same manner as that of the first embodiment, and a similar pre-charge operation is carried out.

The read only semiconductor memory device according to the fifth embodiment has effects similar to those of a device according to the third embodiment. The device of the fifth embodiment is advantageous when the data have some bias in the row direction in the memory cell array 1, which effectively reduces power consumption.

In the fifth embodiment, the memory cell array 1 is divided into two portions along the row direction. However, the number of divisions is not limited to two portions, there may be more than two portions. It is also possible to arrange the specific pattern for the respective arrays divided into more than two parts, and to select the specific pattern according to row address signals.

Embodiment 6.

Figure 11:
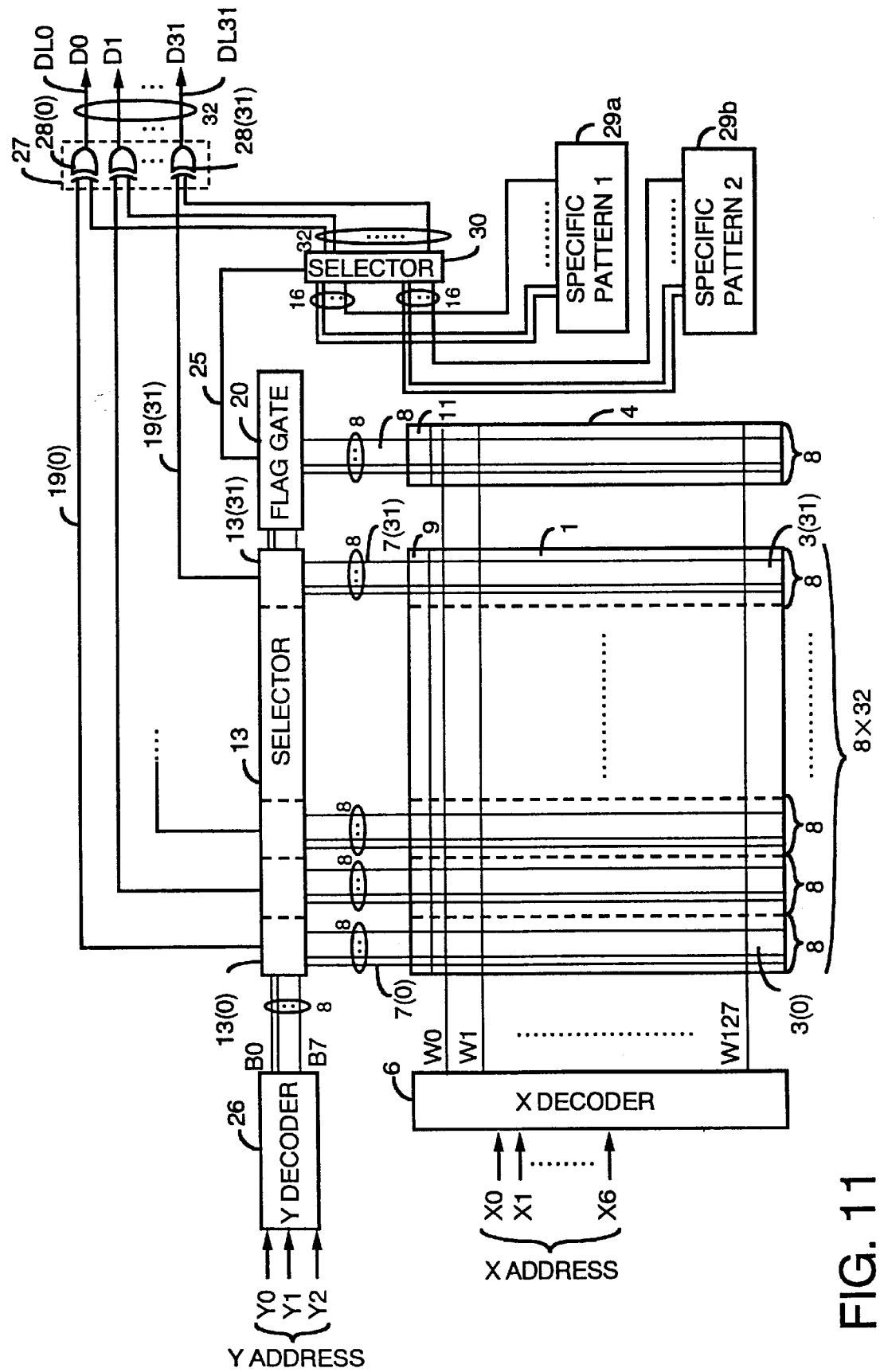
FIG. 11 shows a circuit according to a sixth embodiment of the present invention.

FIG. 11 shows a sixth embodiment of the present invention. In the third embodiment, the specific pattern is determined for the entire memory cell array 1, and the post-converted or the non-converted data are stored (written) for every word in the memory cells 2, based on the specific pattern. In the present sixth embodiment, however, two specific patterns are determined for the memory cell array 1, and the data is stored in the memory cells 2 according to the first conversion pattern or the second conversion pattern for every word. The sixth embodiment is different only in this point from the third embodiment.

Therefore, the sixth embodiment is explained below, focusing on the difference from the third embodiment. In FIG. 11, the same components as those shown in FIG. 7 are represented by the same numbers, so that repeated description of those elements is omitted.

In the circuit of FIG. 11, the memory cells 2 in the memory cell array 1 store the data for every word based on the following rules.

The exclusive logical sum operation is carried out on the word data to be stored and a first specific pattern to obtain first post-converted data, and on the word data to be stored and a second specific pattern to obtain second post-converted data. Then, the number of "0" 's contained in the first post-converted data and the number of "0" 's contained in the second post-converted data are compared, and the data with fewer "0" 's is stored in the memory cells 2.

The flag memory cells 5 in the flag memory cell group 4 store the information "0" or "1", which indicates whether the corresponding word stored in the memory cell array 1 is first post-converted data or second post-converted data.

The output circuit 27 converts the information appearing on the bit lines BL0–BL7 selected by the respective bit line selecting portions 13(0)–13(31), based on the information appearing on the flag bit lines BL0–BL7 selected by the flag bit line selector 20, using the first specific pattern or the second specific pattern, and outputs the result. The output circuit 27 comprises a first specific pattern memory 29a, a second specific pattern memory 29b, and a pattern selector 34.

The first specific pattern memory 29a stores a first specific pattern having the same number of bits as number of the columns of the memory cell groups 3(0)–3(31) (in the sixth embodiment, this number is 32).

The second specific pattern memory 29b stores a second specific pattern having the same number of bits as number of the columns of the memory cell groups 3(0)–3(31). In the respective specific pattern memories 29a and 29b, the memory portion for storing "0" corresponds to a ground potential node, and the memory portion for storing 1 corresponds to a power source potential node.

The pattern switch 30 receives the information appearing on the selected flag bit lines BL–BL7 selected by the flag bit line selector 20. When the received information indicates first converted information, the first specific pattern is output from the first specific pattern memory 29a. When the received information indicates second converted information, the second specific pattern is output from the second specific pattern memory 29b. The pattern switch 30 comprises two MOS transistors having respective gate electrodes receiving post-converted or non-converted information appearing on the selected flag bit lines BL0–BL7, selected by the flag bit line selector 20 via the signal line 25.

The output circuit 27 comprises output portions 28(0)–28(31), which correspond to the respective bit line selecting portions 13(0)–13(31). Input terminals of the respective output portions 28(0)–28(31) are connected to corresponding signal lines 19(0)–19(31), and receive the information which appear on the bit lines BL0–BL7 selected by the bit selecting portions 13(0)–13(31). Other input terminals of the respective output portions 28(0)–28(31) are connected to corresponding outputs of the pattern switch 30. The respective output portions 28(0)–28(31) comprise exclusive logical sum circuits (EX-OR circuit) for inverting or not inverting the information received from the respective bit selecting portions 13(0)–13(31), based on information input from the pattern switch 30.

The first and second specific patterns stored in the first and second specific pattern memories 29a and 29b are determined in the manner explained below.

The first specific pattern memory 29a stores the most frequently appearing patterns which exist in the memory cell array 1 for every word, and the second specific pattern memory 29b stores the second most frequently appearing patterns which exist in the memory cell array 1 for every word.

In this case, the data to be stored in the memory cell array 1 and the bit information to be stored in the flag bit line group 4 are as follows. Since the exclusive logical sum is carried out between the data to be stored and the most frequently appeared pattern, the first specific pattern becomes all "1" 's. The corresponding flag memory cell 5 stores the information "0" which is the first converted information.

Since the exclusive logical sum is carried out between the data to be stored and the second most frequently appearing pattern, the second specific pattern becomes all "1" 's. The corresponding flag memory cell 5 stores the information "1" which is the second converted information.

For the data to be stored for the rest of the words, the exclusive logical sum is carried out between the data to be stored and the first specific pattern, and the first post-converted information is obtained, and the exclusive logical sum is carried out between the data to be stored and the second specific pattern, and the second post-converted information is obtained.

The number of "0" 's in the first post-converted information and the second post-converted information are compared, and the data with fewer "0" 's are stored in the memory cell groups 3(0)–3(31). If the first post-converted data are stored in the memory cell groups 3(0)–3(31), the corresponding flag memory cell 5 stores information "0". If the second post-converted data are stored in the memory cell groups 3(0)–3(31), the corresponding flag memory cell 5 stores the information "1".

The first specific pattern is easily defined by finding the most frequently appearing pattern in the memory cell array, and the second specific pattern is easily defined by finding the second most frequently appearing pattern in the memory cell array. The first and second specific patterns effectively reduce the number of the information "0" 's stored in the memory cells 2.

It is possible to define the first and second specific patterns, such as the most frequently appearing pattern and the third most frequently appearing pattern; the most frequently appearing pattern and the fourth most frequently appearing pattern; the second most frequently appearing pattern and the third most frequently appearing pattern; the most frequently appearing pattern and the fourth most frequently appearing pattern. When selecting the first and the second specific patterns, it is preferable to select a combination where the number of the information "0" 's stored in the memory cells 2 is smallest.

The operation is the same as that of the first embodiment in that the information stored in the memory cells 2 is read according to the row address signals X0–X6 and the column address signals Y0–Y2, and the information read from the memory cells 2 appears on the signal lines 19(0)–19(31).

The operation of the device is also exactly the same as in the first embodiment in that the information stored in flag memory cells 5 is read according to the row address signals X0–X6 and the column address signals Y0–Y2, and the information read from flag memory cells 5 appears on the signal line 25.

Then, the output circuit 27 receives the information appearing on the signal lines 19(0)–19(31) and the information appearing on the signal line 25. The pattern switch 30 provides the first patterns stored in the first specific pattern memory 29a or the second patterns stored in the second specific pattern memory 29b to the output circuit 27, based on the information input from the signal line 25. The respective output portions 28(0)–28(31) in the output circuit 27 carry out the exclusive logical sum between the information from the corresponding signal lines 19(0)–19(31) and the bit information corresponding to the patterns output from the pattern switch 30, that is, the information from the corresponding AND circuits 31(0)–31(31) in the pattern switch 30. Then, the results are output to the corresponding data output lines DL0–DL31 as read data.

Therefore, the information which appears on the data output lines DL0–DL31 corresponds to the information of memory cells 2 in the respective memory cell groups 3(0)–3(31) selected according to the row address signals X0–X6 and the column address signals Y0–Y2, that is, this information corresponds to one word (32 bits) of the read data (data to be stored).

In this manner, the data are read from the memory cell array 1 for every word. After the read period has been terminated, the pre-charge period starts again, in the same manner as that of the third embodiment, and a similar pre-charge operation is carried out.

In the read only semiconductor memory device according to the sixth embodiment, whether the data are converted based on the first or the second specific pattern is stored in the memory cells 5 for every word. When reading the data, the exclusive logical sum is carried out between the read data and the first or the second specific pattern, based on the flag information (flag bit) stored in the flag memory cells 5. In this manner, the number of the information "0" 's to be stored in the memory cells 5 of the memory cell array 1 can be efficiently reduced, which also reduces power consumption.

Regarding the reduction of power consumption, further explanation is added below using a simple specific example. For the sake of simplicity and clarity of explanation, it is assumed in the sixth embodiment that one word comprises 14 bits, instead of 32 bits, just to explain how power consumption is reduced.

FIG. 12 shows the data to be stored and the data written into the memory cells 2 for 7 words. As obvious from FIG. 12, if the data to be stored is equal to the first or the second specific patterns, all "1" data are written into the memory cells 2. If the exclusive logical sum operation is carried out on the word data to be stored and a specific pattern, the number of the information "0" 's is reduce from 47 to 16 (approximately 66 percent reduction) in comparison with a case of no such operation. This result shows that the number of information "0" 's stored in the memory cells 2 are greatly reduced in the sixth embodiment which includes 8×127 words (32 bits/word). The greater the capacity, the fewer information "0" 's are stored in the memory cells 2, and this has the advantageous effect of reducing power consumption. Especially for data such as in an instruction ROM of a microprocessor, which has a strong biasing tendency in generating "0" or "1", it is possible to reduce the number of "0" 's efficiently.

In addition, in a device according to the sixth embodiment, it is possible to reduce the circuit size, and to facilitate high density integration of the circuit in the same manner as in the third embodiment.

Although a first specific pattern and a second specific pattern are used in the explanation of the sixth embodiment, a first through fourth specific patterns may be also used. In this case, the most frequently appearing pattern is defined as a first specific pattern, the second most frequently appearing pattern is defined as a second specific pattern, the third most frequently appearing pattern is defined as a third specific pattern, and the fourthly frequently appeared pattern is defined as a fourth specific pattern. In this case, the flag memory corresponding to the respective words, which are stored in the memory cell array 1, should comprise 2 bits in the flag memory cell group 4.

In summary, by using a plurality (exponent of 2 is preferable) of specific patterns, it is possible to reduce the number of memory cells 2 storing information "0" even farther.

What is claimed is:

1. A read only semiconductor memory device comprising:
   a memory cell array having a plurality of columns of memory cell groups, each memory cell group comprising a plurality of memory cells, arranged in a plurality of rows and columns, for storing information "0" and information "1";
   a flag memory cell group having flag memory cells corresponding to respective memory cells, arranged in a plurality of rows and columns, for storing the information "0" and the information "1" respectively indicating inverted and non-inverted information stored in the corresponding memory cells;
   a plurality of word lines arranged in a plurality of rows, for connection to the corresponding memory cells and the corresponding flag memory cells, respectively;
   a plurality of bit line groups having a plurality of bit lines arranged in a plurality of columns corresponding to respective columns of the memory cells in respective memory cell groups, for connection to the corresponding memory cells of the respective memory cell groups;
   a flag bit line group having a plurality of flag bit lines arranged in a plurality of columns corresponding to respective columns of the flag memory cells of the flag memory cell group, for connection to the corresponding flag memory cells of the flag memory cell group;
   a first pre-charger for pre-charging the plurality of the bit lines in respective bit line groups;
   a second pre-charger for pre-charging the plurality of the flag bit lines in the flag bit line group;
   a bit line selector having a plurality of bit line selecting portions corresponding to the respective bit line groups wherein the respective bit line selecting portions select the bit lines of the corresponding bit line groups in response to bit line selecting signals;
   a flag bit line selector for selecting one of the flag bit lines in the flag bit line group in response to a flag bit line selecting signal; and
   an output circuit for converting and outputting, or for outputting without converting, the information appearing on the bit lines selected by the respective bit line selecting portions, based on the information appearing on the flag bit line selected by the flag bit line selector.

2. The read only semiconductor memory device according to claim 1 wherein the output circuit comprises a plurality of output portions corresponding to the bit line selecting portions of the bit line selector, for inverting or not inverting the information appearing on the bit lines selected by the corresponding bit line selecting portions, based on the information appearing on the flag bit line selected by the flag bit line selector.

3. The read only semiconductor memory device according to claim 2 wherein the first pre-charger comprises a plurality of pre-charge transistors corresponding to the respective bit lines in the respective bit line groups, the respective pre-charge transistors being connected between the corresponding bit lines and power source potential nodes;

the second pre-charger comprises a plurality of pre-charge transistors corresponding to the respective flag bit lines of the flag bit line group, the respective pre-charge transistors being connected between the corresponding flag bit lines and the power source potential nodes;

the respective bit line selecting portions in the bit line selector comprise a plurality of selecting transistors arranged corresponding to the respective bit lines of each bit line group and being connected between the corresponding bit lines and first common nodes, for receiving the bit line selecting signals at respective control electrodes, buffers connected to first input terminals of the corresponding output portions in the output circuit, and pre-charge transistors connected between the power source potential nodes and the first common nodes, respectively;

the flag bit line selector comprises a plurality of selecting transistors corresponding to the respective flag bit lines of the flag bit line group and connected between the corresponding flag bit lines and second common nodes, for receiving the bit line selecting signals at respective control electrodes, buffers connected to second input terminals of the corresponding output portions in the output circuit, and pre-charge transistors connected between the power source potential nodes and the second common nodes; and the output circuit further comprises exclusive logical sum circuits having first input terminals connected to signal lines connected to the corresponding bit line selecting portions in the bit line selector, second input terminals connected to a signal line connected to the flag bit line selector, and output terminals connected to data lines.

4. The read only semiconductor memory device according to claim 1 wherein the output circuit comprises:

a specific pattern memory having bits in the same number as the number of the columns of the memory cell groups in the memory cell array, for storing a specific pattern of the corresponding memory cell array;

a pattern switch for receiving the information on the flag bit line selected by the flag bit line selector, for outputting a specific pattern from the specific pattern memory when receiving converted information, and for outputting a non-specific pattern when receiving non-converted information; and a plurality of output portions corresponding to the bit line selecting portions of the bit line selector for inverting or not inverting the information appearing on the bit lines selected by the corresponding bit line selecting portions according to the pattern information received from the pattern switch.

5. The read only semiconductor memory device according to claim 1 wherein said output circuit comprises:

a plurality of specific pattern memories, each specific pattern memory having bits in the same number as the number of columns of the memory cell groups in the memory cell array, for storing a specific pattern of the corresponding memory cell array;

a pattern selector for selecting and outputting a specific pattern from one of the specific pattern memories based on row address signals;

a pattern switch for receiving the information from the flag bit line selected by the flag bit line selector, for outputting a specific pattern from the pattern selector when the received information is converted, and for outputting a non-specific pattern when the received information is not converted; and a plurality of output portions corresponding to the bit line selecting portions of the bit line selector for inverting or not inverting the information appearing on the bit lines selected by the corresponding line selecting portions according to the pattern information received from the pattern switch.

6. The read only semiconductor memory device according to claim 4 wherein the first pre-charger comprises a plurality of pre-charge transistors corresponding to the respective bit lines in the respective bit line groups, the respective pre-charge transistors being connected between the corresponding bit lines and power source potential nodes;

the second pre-charger comprises a plurality of pre-charge transistors corresponding to the respective flag bit lines of the flag bit line group, the respective pre-charge transistors being connected between the corresponding flag bit lines and the power source potential nodes;

the respective bit line selecting portions in the bit line selector comprise a plurality of selecting transistors, arranged corresponding to the respective bit lines of each bit line group and being connected between the corresponding bit lines and first common nodes, for receiving the bit line selecting signals at respective control electrodes, buffers connected to first input terminals of the corresponding output portions in the output circuit, and pre-charge transistors connected between the power source potential nodes and the first common nodes, respectively;

the flag bit line selector comprises a plurality of selecting transistors corresponding to the respective flag bit lines of the flag bit line group and connected between the corresponding flag bit lines and second common nodes, for receiving the bit line selecting signals at respective control electrodes, buffers connected to second input terminals of the corresponding output portions in the output circuit, and pre-charge transistors connected between the power source potential nodes and the second common nodes; and the output circuit further comprises exclusive logical sum circuits having first input terminals connected to signal lines connected to the corresponding bit line selecting portions in the bit line selector, second input terminals connected to a signal line from the pattern switch, and output terminals connected to data lines.

7. The read only semiconductor memory device according to claim 5 wherein the first pre-charger comprises a plurality of pre-charge transistors corresponding to the respective bit lines in the respective bit line groups, the respective pre-charge transistors being connected between the corresponding bit lines and power source potential nodes;

the second pre-charger comprises a plurality of pre-charge transistors corresponding to the respective flag bit lines of the flag bit line group, the respective pre-charge transistors being connected between the corresponding flag bit lines and the power source potential nodes;

the respective bit line selecting portions in the bit line selector comprise a plurality of selecting transistors, arranged corresponding to the respective bit lines of each bit line group and being connected between the corresponding bit lines and first common nodes, for receiving the bit line selecting signals at respective control electrodes, buffers connected to first input terminals of the corresponding output portions in the output circuit, and pre-charge transistors connected between the power source potential nodes and the first common nodes, respectively;

the flag bit line selector comprises a plurality of selecting transistors corresponding to the respective flag bit lines of the flag bit line group and connected between the corresponding flag bit lines and second common nodes, for receiving the bit line selecting signals at respective control electrodes, buffers connected to second input terminals of the corresponding output portions in the output circuit, and pre-charge transistors connected between the power source potential nodes and the second common nodes; and the output circuit further comprises exclusive logical sum circuits having first input terminals connected to signal lines connected to the corresponding bit line selecting portions in the bit line selector, second input terminals connected to a signal line from the pattern switch, and output terminals connected to data lines.

8. A read only semiconductor memory device comprising:

a memory cell array having a plurality of columns of memory cell groups, and being divided into an upper array and a lower array, each array comprising a plurality of memory cells, arranged in a plurality of rows and columns, for storing information "0" and information "1";

a flag memory cell group divided into upper and lower portions corresponding to the upper and the lower memory cell arrays, respectively, the flag memory cell group having a plurality of flag memory cells, arranged in a plurality of rows and columns, for storing the information "0" and the information "1" respectively indicating inverted and non-inverted information stored in the memory cells corresponding to the upper and the lower arrays;

a plurality of word lines arranged in a plurality of rows, for connection to the corresponding memory cells and the flag memory cells, respectively;

a plurality of bit line groups divided into upper and lower portions corresponding to the upper and the lower memory cell arrays, respectively, the bit line groups having a plurality of bit lines arranged in a plurality of columns corresponding to respective columns of the memory cells in respective memory cell groups for connection to the corresponding memory cells of the respective memory cell groups;

a plurality of flag bit line groups divided into upper and lower portions corresponding to the upper and the lower memory cell arrays, the flag bit line groups having a plurality of flag bit lines arranged in a plurality of columns corresponding to respective columns of the flag memory cells of the flag memory cell group for connection to the corresponding flag memory cells of the flag memory cell group;

a first pre-charger for pre-charging the plurality of the bit lines in respective bit line groups;

a second pre-charger for pre-charging the plurality of the flag bit lines in the flag bit line groups;

a bit line selector, divided into upper and lower portions corresponding to the upper and the lower memory cell arrays, the bit line selector having a plurality of bit line selecting portions corresponding to the respective bit line groups, wherein the respective bit line selecting portions select the bit lines of the corresponding bit line groups in response to bit line selecting signals;

a flag bit line selector, divided into upper and lower portions corresponding to the upper and the lower memory cell arrays, for selecting one of the flag bit lines in the flag bit line groups in response to a flag bit line selecting signal; and an output circuit, divided into upper and lower portions corresponding to the upper and the lower memory cell arrays, for converting and outputting, or for outputting, without converting, the information appearing on the bit lines selected by the respective bit line selecting portions, based on the information appearing on the flag bit line selected by the flag bit line selector.

9. The read only semiconductor memory device according to claim 8 wherein the upper and lower portions of the output circuit comprise a plurality of output portions arranged corresponding to the bit line selecting portions of the bit line selector, the corresponding output portions inverting and outputting, or outputting without inverting the information appearing on the bit lines selected by the bit line selecting portions, based on the information appearing on the flag bit line selected by the corresponding upper and lower portions in the flag bit line selector.

10. The read only semiconductor memory device according to claim 9 wherein the first pre-charger comprises a plurality of pre-charge transistors corresponding to the respective bit lines in the respective bit line groups, the respective pre-charge transistors being connected between the corresponding bit lines and power source potential nodes;

the second pre-charger comprises a plurality of pre-charge transistors corresponding to the respective flag bit lines of the flag bit line groups, the respective pre-charge transistors being connected between the corresponding flag bit lines and the power source potential nodes;

the respective bit line selecting portions in the bit line selector comprise a plurality of selecting transistors arranged corresponding to the respective bit lines of each bit line group and being connected between the corresponding bit lines and first common nodes, for receiving the bit line selecting signals at respective control electrodes, buffers connected to first input terminals of the corresponding output portions in the output circuit, and pre-charge transistors connected between the power source potential nodes and the first common nodes, respectively;

the flag bit line selector comprises a plurality of selecting transistors corresponding to the respective flag bit lines of the flag bit line groups and connected between the corresponding flag bit lines and second common nodes, for receiving the bit line selecting signals at respective control electrodes, buffers connected to second input terminals of the corresponding output portions in the output circuit, and pre-charge transistors connected between the power source potential nodes and the second common nodes; and the output circuit further comprises exclusive logical sum circuits having first input terminals are connected to signal lines connected to the corresponding bit line selecting portions in the bit line selector, second input terminals connected to a signal line connected to the flag bit line selector, and output terminals connected to data lines.

11. The read only semiconductor memory device according to claim 8 wherein said upper and lower portions of the output circuit comprise:
- specific pattern memories, each specific pattern memory having bits in the same number as the number of the columns of the memory cell groups in the memory cell array for storing a specific pattern of the corresponding upper and lower memory cell arrays;
- a plurality of pattern switches, corresponding to the upper and lower memory cell arrays, for receiving the information on the flag bit line selected by the flag bit line selector, for outputting a specific pattern from the specific pattern memory when receiving converted information, and for outputting a non-specific pattern when receiving non-converted information; and
- a plurality of output portions corresponding to the bit line selecting portions of the bit line selector for inverting or not inverting the information appearing on the bit lines selected by the corresponding bit line selecting portions according to the pattern information received from the pattern switches.

12. The read only semiconductor memory device according to claim 11 wherein
- the first pre-charger comprises a plurality of pre-charge transistors corresponding to the respective bit lines in the respective bit line groups, the respective pre-charge transistors being connected between the corresponding bit lines and power source potential nodes;
- the second pre-charger comprises a plurality of pre-charge transistors corresponding to the respective flag bit lines of the flag bit line groups, the respective pre-charge transistors being connected between the corresponding flag bit lines and the power source potential nodes;
- the respective bit line selecting portions in the bit line selector comprise a plurality of selecting transistors, arranged corresponding to the respective bit lines of each bit line group and being connected between the corresponding bit lines and first common nodes, for receiving the bit line selecting signals at respective control electrodes, buffers connected to first input terminals of the corresponding output portions in the output circuit, and pre-charge transistors connected between the power source potential nodes and the first common nodes, respectively;
- the flag bit line selector comprises a plurality of selecting transistors corresponding to the respective flag bit lines of the flag bit line groups and connected between the corresponding flag bit lines and second common nodes, for receiving the bit line selecting signals at respective control electrodes, buffers connected to second input terminals of the corresponding output portions in the output circuit, and pre-charge transistors connected between the power source potential nodes and the second common nodes; and
- the output circuit further comprises exclusive logical sum circuits having first input terminals connected to signal lines connected to the corresponding bit line selecting portions in the bit line selector, second input terminals connected to a signal line connected to the flag bit line selector, and output terminals connected to data lines.

13. A read only semiconductor memory device comprising:
- a memory cell array having a plurality of columns of memory cell groups, each memory cell group comprising a plurality of memory cells, arranged in a plurality of rows and columns, for storing information "0" and information "1";
- a flag memory cell group having flag memory cells corresponding to respective memory cells, arranged in a plurality of rows and columns, for storing the information "0" and the information "1" indicating information stored in the memory cells based on a first specific pattern and information stored in the memory cells based on a second specific pattern, respectively;
- a plurality of word lines arranged in a plurality of rows, for connection to the corresponding memory cells and the corresponding flag memory cells, respectively;
- a plurality of bit line groups having a plurality of bit lines arranged in a plurality of columns corresponding to respective columns of the memory cells in respective memory cell groups, for connection to the corresponding memory cells of the respective memory cell groups;
- a flag bit line group having a plurality of flag bit lines arranged in a plurality of columns corresponding to respective columns of the flag memory cells of the flag memory cell group for connection to the corresponding flag memory cells of the flag memory cell group;
- a first pre-charger for pre-charging the plurality of the bit lines in respective bit line groups;
- a second pre-charger for pre-charging the plurality of the flag bit lines in the flag bit line group;
- a bit line selector having a plurality of bit line selecting portions corresponding to the respective bit line groups wherein the respective bit line selecting portions select the bit lines of the corresponding bit line groups in response to bit line selecting signals;
- a flag bit line selector for selecting one of the flag bit lines in the flag bit line group in response to a flag bit line selecting signal; and
- an output circuit for converting the information appearing on the bit lines selected by the bit line selecting portions in the bit line selector, according to one of the first specific pattern and the second specific pattern based on the information appearing on the flag bit line selected by the flag bit line selector.

14. The read only semiconductor memory device according to claim 13 wherein said output circuit comprises:
- a first specific pattern memory for storing the first specific pattern;
- a second specific pattern memory for storing the second specific pattern;
- a pattern switch for outputting the first specific pattern or the second specific pattern based on the information appearing on the flag bit line selected by the flag bit line selector; and
- a plurality of output portions corresponding to the bit line selecting portions of the bit line selector for inverting or not inverting the information appearing on the bit lines selected by the corresponding bit line selecting portions according to which of the first and second specific patterns is received from the pattern switch.

15. The read only semiconductor memory device according to claim 14 wherein
- the first pre-charger comprises a plurality of pre-charge transistors corresponding to the respective bit lines in the respective bit line groups, the respective pre-charge transistors being connected between the corresponding bit lines and power source potential nodes;
- the second pre-charger comprises a plurality of pre-charge transistors corresponding to the respective flag bit lines of the flag bit line group, the respective pre-charge transistors being connected between the corresponding flag bit lines and the power source potential nodes;

the respective bit line selecting portions in the bit line selector comprise a plurality of selecting transistors, arranged corresponding to the respective bit lines of each bit line group and being connected between the corresponding bit lines and first common nodes, for receiving the bit line selecting signals at respective control electrodes, buffers connected to first input terminals of the corresponding output portions in the output circuit, and pre-charge transistors connected between the power source potential nodes and the first common nodes, respectively;

the flag bit line selector comprises a plurality of selecting transistor, corresponding to the respective flag bit lines of the flag bit line group and connected between the corresponding flag bit lines and second common nodes, for receiving the bit line selecting signals at respective control electrodes, buffers connected to second input terminals of the corresponding output portions in the output circuit, and pre-charge transistors connected between the power source potential nodes and the second common nodes; and the output circuit further comprises exclusive logical sum circuits having first input terminals connected to signal lines connected to the corresponding bit line selecting portions in the bit line selector, second input terminals connected to a signal line from the pattern switch, and output terminals connected to data lines.

* * * * *